United States Patent
Kitayoshi et al.

(10) Patent No.: US 10,567,013 B2
(45) Date of Patent: Feb. 18, 2020

(54) ROTARY SYSTEM MOUNTED PIEZOELECTRIC GENERATOR, SELF-POWERED WIRELESS COMMUNICATION TERMINAL AND WIRELESS COMMUNICATION SYSTEM

(71) Applicant: TOHOKU UNIVERSITY, Sendai-Shi, Miyagi (JP)

(72) Inventors: Hitoshi Kitayoshi, Sendai (JP); Hiroki Kuwano, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 530 days.

(21) Appl. No.: 15/514,196

(22) PCT Filed: Oct. 8, 2015

(86) PCT No.: PCT/JP2015/078665
§ 371 (c)(1),
(2) Date: Mar. 24, 2017

(87) PCT Pub. No.: WO2016/060065
PCT Pub. Date: Apr. 21, 2016

(65) Prior Publication Data
US 2017/0310345 A1 Oct. 26, 2017

(30) Foreign Application Priority Data

Oct. 17, 2014 (JP) .................. 2014-212653

(51) Int. Cl.
*H01L 41/113* (2006.01)
*H04B 1/04* (2006.01)
(Continued)

(52) U.S. Cl.
CPC ............ *H04B 1/04* (2013.01); *H01L 41/1136* (2013.01); *H02N 2/18* (2013.01); *H02N 2/186* (2013.01); *H04L 27/183* (2013.01)

(58) Field of Classification Search
CPC ........ H04B 1/04; H01L 41/1136; H02N 2/18; H02N 2/186; H04L 27/183
(Continued)

(56) References Cited

U.S. PATENT DOCUMENTS

| 5,519,381 A | 5/1996 | Marsh et al. |
| 5,726,630 A | 3/1998 | Marsh et al. |

(Continued)

FOREIGN PATENT DOCUMENTS

| EP | 2113953 A1 | 11/2009 |
| JP | H09-115685 A | 5/1997 |

(Continued)

OTHER PUBLICATIONS

Oct. 2, 2017 Search Report issued in European Patent Application No. 15849993.9.
(Continued)

*Primary Examiner* — Thomas M Dougherty
(74) *Attorney, Agent, or Firm* — Oliff PLC

(57) ABSTRACT

A rotary system mounted piezoelectric generator has a folded beam structure in which the whole or part of a spring is formed with a piezoelectric generation element, in which one end is provided in a drive rotation system and in which a weight is attached to the other end, the degree of freedom of motion of the weight is two or more-dimensional and thus it is possible to easily change the locus thereof. The beam has a spiral structure such that when the drive rotation system is rotated, a centrifugal force applied to the weight is efficiently modulated by a second force other than the centrifugal force. A self-powered wireless communication terminal is operated with an extremely small amount of power consumption by use of a wireless connection control means and a modulation scattering response antenna which perform multilevel phase-shift keying (MPSK).

16 Claims, 11 Drawing Sheets

(A) SIMPLE CANTILEVER BEAM (B) FOLDED SPRING BEAM

(51) Int. Cl.
*H02N 2/18* (2006.01)
*H04L 27/18* (2006.01)

(58) Field of Classification Search
USPC .................................. 310/318, 319, 339
See application file for complete search history.

(56) References Cited

U.S. PATENT DOCUMENTS

| | | | |
|---|---|---|---|
| 6,246,287 | B1 | 6/2001 | Yamashita |
| 7,729,768 | B2 * | 6/2010 | White ................. H01L 41/1136 310/319 |
| 8,174,167 | B2 * | 5/2012 | Gammaitoni .......... H02N 2/186 310/319 |
| 8,183,746 | B2 * | 5/2012 | Rastegar ............... F42C 11/008 102/207 |
| 2003/0095678 | A1 | 5/2003 | Hooley et al. |
| 2005/0280334 | A1 | 12/2005 | Ott et al. |
| 2010/0084947 | A1 * | 4/2010 | Yoon ................... H01L 41/1136 310/339 |
| 2010/0245052 | A1 | 9/2010 | Kitayoshi |
| 2011/0068949 | A1 | 3/2011 | Ieda et al. |
| 2011/0252880 | A1 | 10/2011 | Hama |
| 2012/0080981 | A1 | 4/2012 | Horiguchi et al. |
| 2013/0293069 | A1 | 11/2013 | Sakaguchi et al. |
| 2013/0314215 | A1 | 11/2013 | Kitayoshi |
| 2014/0035438 | A1 * | 2/2014 | Livermore-Clifford .................... A61K 49/0041 310/339 |
| 2017/0040911 | A1 * | 2/2017 | Tatarchuk ............... H01L 41/18 |

FOREIGN PATENT DOCUMENTS

| | | |
|---|---|---|
| JP | 2000-266776 A | 9/2000 |
| JP | 2000-321299 A | 11/2000 |
| JP | 2003-518752 A | 6/2003 |
| JP | 2003-318776 A | 11/2003 |
| JP | 2004-032929 A | 1/2004 |
| JP | 2004-164091 A | 6/2004 |
| JP | 2006-238523 A | 9/2006 |
| JP | 2007-158996 A | 6/2007 |
| JP | 2007-184860 A | 7/2007 |
| JP | 2008-035334 A | 2/2008 |
| JP | 2008-099489 A | 4/2008 |
| JP | 2008-219624 A | 9/2008 |
| JP | 2010-136535 A | 6/2010 |
| JP | 2011-071646 A | 4/2011 |
| JP | 2012-047635 A | 3/2012 |
| JP | 2013-223347 A | 10/2013 |
| WO | 01/047041 A2 | 6/2001 |
| WO | 03/038919 A1 | 5/2003 |
| WO | 2008/029769 A1 | 3/2008 |
| WO | 2012/067707 A1 | 5/2012 |
| WO | 2012/090840 A1 | 7/2012 |

OTHER PUBLICATIONS

Shimanouchi et al.; "A Wireless Motor-Condition, Precise Analysis System using a Highly Efficient Vibration-Energy Harvester;" 2013 IEEE 11th International Conference on Industrial Informatics; Proceedings of INDIN 2013; Jul. 2013; pp. 402-407.

Dec. 28, 2015 International Search Report issued in International Patent Application No. PCT/JP2015/078665.

Apr. 22, 2019 Notice of Reasons for Refusal issued in Japanese Application No. 2016-554060.

* cited by examiner (A) SIMPLE CANTILEVER BEAM (B) FOLDED SPRING BEAM (a) VIBRATION PHASE LAG OF WEIGHT IS ZERO
<<LOW-SPEED ROTATION RESPONSE>>

(b) VIBRATION PHASE LAG OF WEIGHT IS 90°
<<ROTATION RESPONSE AT TIME OF RESONANCE>>

(c) VIBRATION PHASE LAG OF WEIGHT IS 180°
<<HIGH-SPEED ROTATION RESPONSE>>

| NUMBER OF REVOLUTIONS | FORWARD WINDING SPRING | REVERSE WINDING SPRING |
|---|---|---|
| 285 rpm | | |
| 360 rpm | | |
| 480 rpm | | |

ROTARY SYSTEM MOUNTED PIEZOELECTRIC GENERATOR, SELF-POWERED WIRELESS COMMUNICATION TERMINAL AND WIRELESS COMMUNICATION SYSTEM

TECHNICAL FIELD

The present invention relates to a rotary system mounted piezoelectric generator, a self-powered wireless communication terminal and a wireless communication system.

BACKGROUND ART

As a conventional vibration environment generator, a technology disclosed in non-patent literature 1 is known. The non-patent literature 1 discloses that in order for the vibration waveform of a vacuum pump to be remotely monitored, the vibration waveforms of 50 samples are observed every 5 seconds by vibration environment power generation using a simple cantilever beam magnetostrictive element and an electromagnetic induction coil. The simple cantilever beam magnetostrictive element is a resonance system which indicates a high Q value at 90 Hz, and an electromagnetic induction coil output of 28 mW at a vibration acceleration of 0.5 g (90 Hz) is obtained. However, since as a wireless communication means for a vibration waveform, IEEE 802.15.4 (ZigBee) is used, power consumption at the time of data transmission is so large as to be about 60 mW. In order to decease the power consumption by the AD conversion of the vibration waveform, unipolar AD conversion is performed without use of an amplifier circuit, with the result that only the +side of the vibration waveform can be monitored and that the −side is converted into zero.

In a simple cantilever beam plate-shaped piezoelectric element mounted on a tire rotary system or the like, since a gravitational acceleration change of G=9.8 m/s² [0 (vertically downward)→−G (horizontal surface upward)→0 (vertically upward)→+G (horizontal surface downward)→0 (vertically downward)] (in the case of counterclockwise rotation) in a vertical direction per revolution is given, it is possible to expect a relatively large environment power generation power supply. FIG. 1 shows a photograph of a conventional simple cantilever beam piezoelectric generation element and the result of the frequency response evaluation of an output charge at a vertical vibration acceleration of g=0.5 m/s².

Here, the short-circuit current $I_s$ of the piezoelectric generation element is given as:

[Formula 1]

$$I_s = \pi f Q_p \sqrt{3} \quad (1)$$

An open voltage $V_o$ is given as:

[Formula 2]

$$V_o = Q_p/(C_o\sqrt{2}) \quad (2)$$

Here, f is a vibration frequency, $Q_p$ is the peak value of the output charge and $C_o$ is the capacitance of the piezoelectric element. When the vibration frequency is assumed to be constant, $Q_p$ is proportional to the vibration acceleration g.

In FIG. 1, the piezoelectric generation element has a simple cantilever beam structure in which on the beam of SUS (stainless steel plate), PVDF (polyvinylidene fluoride) is formed and in which a weight is loaded at one end. Here, the PVDF has piezoelectric properties. The piezoelectric generation element resonates at 10.44 Hz, and when the vertical vibration acceleration is g=G, a short-circuit current of $I_s$=1064 μArms and an open voltage $V_o$=182 Vrms are obtained. However, since the vibration acceleration g which can be actually applied at the time of resonance is restricted by the displacement amplitude of the cantilever beam, it is up to about g=G/3. When in non-resonance, the vertical vibration acceleration is g=G, $I_s$=42 μArms and $V_o$=15 Vrms at f=5 Hz, and $I_s$=53 μArms and $V_o$=4.7 Vrms at f=20 Hz. Although the matched resistance $Z_o$ of the piezoelectric generation element is given as $Z_o = V_o/I_s = 1/(2\pi f C_o)$, and it depends on the vibration frequency f, it is found that in the evaluated element, the vertical vibration acceleration is assumed to be g=G and that thus it is possible to constantly acquire a short-circuit current of 42 μArms or more and an open voltage of 4.7 Vrms or more in the range of the vibration frequency f from 5 Hz to 20 Hz.

FIG. 2 is a block diagram showing the structure of an experimental device invented in the present invention in order to evaluate the conventional simple cantilever beam piezoelectric generation element shown in FIG. 1 and its rotation response power generation amount. In the figure, a charge amplifier converts the output charge of the piezoelectric generation element into a voltage, and performs AD conversion on this voltage with a resolution of 10 bits at a rate of 300 sps. Waveform digital data resulting from the AD conversion is supplied and transmitted, by performing multilevel phase-shift keying (MPSK) modulation on a response subcarrier signal of $f_s$=50 kHz, to a cavity-backed slot antenna for modulation scattering disclosed in patent literature 1. The power consumption of a wireless waveform monitoring terminal which was produced experimentally for verifying this invention is 480 μW including the charge amplifier, and the wireless waveform monitoring terminal is driven by a 3 V coin-type battery (CR 1632). In this experimental device, it is assumed that M=4 (quadrature phase-shift keying), and a signal obtained by performing phase modulation on the response subcarrier signal $f_s$ in units of 2-bit information is generated with a subroutine program within a control IC (PIC16F684). A subroutine program which generates, at a code multiplexing rate that is not limited to M=4, phase modulation signals for a plurality of types of response subcarrier frequencies is prepared or the clock frequency of the control IC is changed, and thus it is possible to cope with frequency division multiple access (FDMA) and variable encoding rate communication.

FIG. 3 is a configuration diagram of a receiving device invented in the present invention for a wireless waveform monitoring terminal shown in FIG. 2. In this device, two linearly polarized wave microstrip antennas (V pol. and H pol.) and (0° and 90°) phase shift distributor•combiner are used to combine a circularly polarized wave, and thus a inquire carrier CW signal $f_o$ is transmitted, and the response MPSK subcarrier signal $f_o \pm f_s$ is received. Although an antenna for the wireless waveform monitoring terminal shown in FIG. 2 uses a linearly polarized wave, since the antenna itself is mounted on a rotation system, a polarized wave tilt angel is constantly varied. On the other hand, an antenna on the side of the receiving device shown in FIG. 3 uses a circularly polarized wave, and thus the reception level of a response signal which does not depend on a rotation angle on the side of the wireless waveform monitoring terminal is acquired. Since this reception signal contains a leakage component in the circulator of the inquire carrier signal $f_o$ and a reflection component in the antenna, part of the transmitted CW signal $f_o$ is subjected to amplitude adjustment and phase reversal such that additive cancellation is performed thereon. The response MPSK subcarrier signal $f_o \pm f_s$ received from the wireless waveform monitoring terminal is passed through a RF frequency band limiting filter (2.45±0.5 GHz), is thereafter amplified at the LNA of 20 dB gain, is orthogonally detected by the transmitted CW signal $f_o$, obtains a MPSK subcarrier complex signal $\pm f_s$ component, is then amplified with a 50-90 dB variable gain amplifier (IF amp), is passed through a switched capacitor (SW-Cap.)±50±5 kHz band pass filter and is thereby subjected to AD conversion at 12 bit/200 ksps. In a DSP for MPSK demodulation (dsPIC33FJ256GP710), discrete Fourier transform (DFT) processing is performed on the complex signal resulting from the AD conversion, only $+f_s$ component is detected, an I/Q axis rotation operation for correcting a frequency displacement in the subcarrier signal is performed and then a MPSK demodulation operation corresponding to each information area on I/Q axis coordinates is performed, with the result that it is possible to demodulate the wireless waveform monitoring terminal response signal up to about −110 dBm on the antenna reception level. A unique word for detecting a frequency displacement between a reference phase and the subcarrier signal is attached to the response signal from the wireless waveform monitoring terminal for each bit string packet.

FIG. 4 is an example where the result of an experiment performed with a rotation response wireless waveform monitoring device in the conventional simple cantilever beam piezoelectric vibration generator shown in FIG. 2 is recorded with a receiver shown in FIG. 3. In this graph, with respect to an elapsed time t on the horizontal axis, a piezoelectric element output charge when the number of revolutions is increased and decreased and sweeping is performed is plotted as a waveform on the vertical axis. Around the elapsed time of t=30 seconds, the number of revolutions was 600 rpm, and the piezoelectric element short-circuit current at that time was 19 µArms. This value is about 0.02 times the short-circuit current when the vertical vibration acceleration g=G at a resonant frequency of f=10 Hz shown in FIG. 1. In this case, as compared with gravity, a centrifugal force is significantly exerted. In the case of this experiment, when it is assumed that the rotation radius r of a weight M is 13 cm, the centrifugal force is 512.7 M [N] at 600 rpm whereas the gravity is 9.8 M [N]. This means that a vector exerted on the weight is varied only by about ±1° due to a variation in gravity caused by the rotation, and it can be considered that this is because the resonant vibration displacement amplitude of the piezoelectric element is restricted to 0.02 times. On the other hand, in this figure, the number of revolutions around the elapsed time of t=43 seconds was 300 rpm, and the piezoelectric element short-circuit current at that time was 23 µArms. This value is about 0.55 times the short-circuit current when the vertical vibration acceleration g=G at a nonresonant frequency of f=5 Hz shown in FIG. 1. The number of revolutions around the elapsed time of t=16 seconds was 420 rpm, and the piezoelectric element short-circuit current at that time was 31 µArms. This value is about 0.35 times the short-circuit current when the vertical vibration acceleration g=G at a nonresonant frequency of f=7 Hz shown in FIG. 1. As is found from the observation results, the vibration power generation amount of the conventional simple cantilever beam piezoelectric element by the gravity of the rotation system is significantly reduced by an increase in the centrifugal force.

CITATION LIST

Non Patent Literature

Non Patent Literature 1: T. Shimanouchi, O. Toyoda, F. Nakazawa, "A Wireless Motor-Condition, Precise Analysis System Using a Highly Efficient Vibration-Energy Harvester", 2013 IEEE 11th International Conference on Industrial Informatics, Proceedings of INDIN 2013, July 2013, pp. 402-407

PATENT LITERATURE

Patent Literature 1: International Publication No. WO2008/029769
Patent Literature 2: International Publication No. WO2012/090840

SUMMARY OF INVENTION

Technical Problem

Problems in non-patent literature 1 are described below.
(1) Since consideration is not given to a centrifugal force, it is impossible to utilize a vibration environment generation element by directly mounting it on a rotation system such as a tire.
(2) Since the vibration environment generation element is a high Q value resonance system, power can be generated with high efficiency only by vibrations of specific narrow frequency bandwidth.
(3) Since as a wireless communication means, an active type (where a terminal itself transmits radio waves) is used, its power consumption is high, and thus an intermittent operation is indispensable, with the result that it is impossible to perform continuous waveform monitoring.
(4) Since an alternating-current signal is directly observed with a unipolar AD converter, a value on one polarity side of a vibration waveform is zero, and thus it is impossible to perform monitoring.

The present invention is made in view of the foregoing problems, and has an object to provide a rotary system mounted piezoelectric generator which can be utilized by being directly mounted on a rotation system such as a tire and which can generate power in a wide range of numbers of revolutions with high efficiency. The present invention also has an object to provide a self-powered wireless communication terminal in which as a wireless communication means, subcarrier MPSK modulation scattering is used such that an extremely small amount of power is consumed and that radio interference is unlikely to be received and which can monitor a continuous vibration waveform and the like in real time, and a wireless communication system which uses such a self-powered wireless communication terminal. The present invention also has an object to provide a self-powered wireless communication terminal and a wireless communication system which can monitor signals of ±both polarities of a vibration waveform by observing an alternating-current signal with a unipolar AD converter by offset AC coupling.

Solution to Problem

In order to achieve the above objects, a rotary system mounted piezoelectric generator according to the present invention includes: a beam in which the whole or part thereof is formed of a piezoelectric material and whose one end is provided in a rotation system; and a weight which is attached to the other end of the beam, the beam is formed by a folded structure in which the beam is extended from an installation point of the rotation system to the weight toward the direction of a rotation center of the rotation system such that when the rotation system is rotated, a centrifugal force applied to the weight is modulated by a second force other than the centrifugal force, the degree of freedom of motion of the weight when seen from the rotation system is two or more-dimensional and the beam is constantly deformed so as to correspond to a variation in the sum of a vector of the centrifugal force applied to the weight and a vector of the second force which does not depend on the number of revolutions of the rotation system such that the rotation center of the weight is moved according to the number of revolutions of the rotation system with the degree of freedom which is two or more-dimensional and that the locus of the weight can be changed, with the result that it is possible to obtain a large amount of power generated over a wide range of numbers of revolutions.

The rotary system mounted piezoelectric generator according to the present invention is mounted on a rotation system such as a vehicle tire, and thus part of the rotation energy of the rotation system can be converted into electrical energy with a piezoelectric material. Here, preferably, the rotary system mounted piezoelectric generator according to the present invention includes a beam in which the whole thereof or part is formed of the piezoelectric material and whose one end is provided in the rotation system and a weight which is attached to the other end of the beam, and the degree of freedom of motion of the weight when seen from the rotation system is two or more-dimensional, and the beam is constantly deformed so as to correspond to a variation in a vector acting on the weight such that the locus of the weight can easily be changed.

Preferably, in the rotary system mounted piezoelectric generator according to the present invention, when the rotation system is rotated, and the beam is formed in the shape of an arc having a diameter on a line connecting an installation point of the rotation system and the rotation center of the rotation system such that the motion locus of the weight is displaced from a true circle in which the rotation center of the rotation system is a center point, the length of the arc of the beam when seen from the installation point of the rotation system falls within a range from 120° to 240°. Preferably, when the rotation system is rotated, the motion locus of the weight is displaced by the second force other than the centrifugal force exerted on the weight from a true circle in which the rotation center of the rotation system is a center point such that the centrifugal force which is changed in the shape of an ellipse or a dynamic closed loop according to the number of revolutions of the rotation system and which is modulated. In this case, the motion locus of the weight is displaced from the true circle in which the rotation center of the rotation system is the center point, and thus it is possible to obtain power generated.

Preferably, in the rotary system mounted piezoelectric generator according to the present invention, the second force is gravity which is exerted on the weight. In this case, the centrifugal force is modulated by the vibration of the weight resulting from the gravity, and thus it is possible to obtain a larger amount of power generated.

The rotary system mounted piezoelectric generator according to the present invention is a non-resonant system in which the centrifugal force exerted on the weight is modulated by a second force other than the centrifugal force and in which thus a larger amount of power generated is obtained, and thus it is possible to obtain a larger amount of power generated in a wide range of numbers of revolutions.

Preferably, in the rotary system mounted piezoelectric generator according to the present invention, the beam has a spiral structure and is arranged on a plane perpendicular to a rotation shaft of the rotation system. In this case, with the beam having the spiral structure, it is possible to obtain a larger amount of power generated in a wide range of numbers of revolutions.

In the rotary system mounted piezoelectric generator according to the present invention, the one end of the beam may be inclined and fixed to the rotation system by a movable spring structure such that the degree of freedom of motion of the weight is improved and that a vibration mode is increased. In this case, the vibration mode of the weight is increased, and thus it is possible to obtain a larger amount of power generated in a wider range of numbers of revolutions.

In the rotary system mounted piezoelectric generator according to the present invention, the weight may include a magnet or a ferromagnetic material, the second force may be formed by a magnetic force and the centrifugal force acting on the weight may be modulated by a variation in the magnetic force exerted on the weight. In this case, for example, even when in the rotation system installed horizontally, the vibration of the weight by gravity is not produced, the vibration of the weight is produced by a variation in the magnetic force resulting from the rotation so as to modulate the centrifugal force, and thus it is possible to obtain a larger amount of power generated. The weight may include a fluid resistor, the second force may be formed by a fluid resistance force and the centrifugal force exerted on the weight may be modulated by a variation in the fluid resistance force exerted on the weight. In this case, for example, even when in the rotation system installed horizontally, the vibration of the weight by gravity is not produced, the vibration of the weight is produced by a variation in the fluid resistance force resulting from the rotation so as to modulate the centrifugal force, and thus it is possible to obtain a larger amount of power generated.

A self-powered wireless communication terminal according to the present invention includes: a wireless communication means which transmits digital data from an AD converter; and the rotary system mounted piezoelectric generator according to the present invention, and alternating-current power obtained by the rotary system mounted piezoelectric generator is rectified and stored, is stabilized in voltage by being stepped down or stepped up and is used as a power supply voltage for the AD converter and the wireless communication means.

The self-powered wireless communication terminal according to the present invention can measure information on the vibration, the temperature, the pressure and the like of the mounted rotation system by use of electrical energy which is obtained by the rotary system mounted piezoelectric generator capable of generating power over a wide range of numbers of revolutions. With a wireless communication means, it is possible to monitor the information (digital data) from the outside. As described above, the self-powered wireless communication terminal according to the present invention drives a wireless sensor by self-sustaining power generation over a wide range of numbers of revolutions, and thus it is possible to perform the monitoring.

In the self-powered wireless communication terminal according to the present invention, as the wireless communication means, a passive reflection type (the terminal itself modulates and reflects radio waves) is used, and thus with an extremely small amount of power consumption, it is possible to monitor a continuous vibration waveform. It is also possible to monitor signals of ±both polarities of a vibration waveform by observing an alternating-current signal with a unipolar AD converter by offset AC coupling.

Preferably, the self-powered wireless communication terminal according to the present invention includes: a piezoelectric sensor which is connected to the AD converter such that a sensor output is input to the AD converter; an AC coupling capacitor which is connected between the AD converter and the piezoelectric sensor; and a capacitor and a resistor which are connected in parallel to an output of the piezoelectric sensor so as to adjust the sensitivity of the output of the piezoelectric sensor and a low frequency response cutoff frequency, and a resistor voltage division direct-current voltage of the power supply voltage is added to an output voltage of the piezoelectric sensor which is AC coupled such that the output voltage of the piezoelectric sensor is offset by a direct-current voltage and is input to the AD converter. In this case, with the AD converter which is operated with a unipolar power supply, it is possible to monitor the output waveform of a vibration sensor or the like which has a predetermined sensitivity and a low frequency response cutoff frequency.

Preferably, in the self-powered wireless communication terminal according to the present invention, the wireless communication means uses a communication system for performing multilevel phase-shift keying (MPSK) on a subcarrier signal to conduct demodulation scattering so as to perform wireless communication. In this case, as compared with a conventional active-type wireless connection means such as ZigBee, it is possible to reduce power to one hundredth or less as power saving. Hence, even in self-sustaining power generation, it is possible to monitor a continuous waveform, excellent noise-resistant properties are provided and it is also possible to perform simultaneous reading from a plurality of readers and frequency multiplexed communication.

A wireless communication system according to the present invention includes: the self-powered wireless communication terminal according to the present invention; and one or more readers, the reader utilizes the maximization of a reception signal amplitude of the reader with timing at which the antenna polarized wave condition of the self-powered wireless communication terminal and the antenna polarized wave condition of the reader coincide with each other or with timing of the shortest distance so as to estimate an instantaneous rotation angle of the rotation system, to evaluate a correlation function of the rotation angle of the rotation system with respect to data received from the self-powered wireless communication terminal, to perform rotational coordinate transformation so as to transform the received data by the rotation angle of the rotation system into a stationary coordinate system and to monitor the number of revolutions of the rotation system.

In the wireless communication system according to the present invention, it is possible to evaluate the correlation relationship between the rotation position of the self-powered wireless communication terminal and the vibration waveform or the like received by the reader. In this way, the eccentricity monitoring of the rotation system is performed or the rotational coordinate transformation is performed at a detection rotational angle, and thus it is possible to evaluate sensor vector data at the stationary coordinate system.

In the wireless communication system according to the present invention, two or more of the readers may be provided, and the readers may use different inquire carrier signal frequencies so as to avoid radio interference and can simultaneously and continuously read transmission information from one or more of the self-powered wireless communication terminals. In this case, when a transmission signal from one self-powered wireless communication terminal is simultaneously received by a plurality of readers with a modulation scattering communication system, it is possible to avoid a reading failure caused by radio interference.

In the wireless communication system according to the present invention, two or more of the self-powered wireless communication terminals may be provided, the self-powered wireless communication terminals may have different response subcarrier signal frequencies and the readers may utilize the response subcarrier signal frequencies of the self-powered wireless communication terminals so as to avoid radio interference and be able to simultaneously and continuously read the transmission information from the self-powered wireless communication terminals. In this case, when a transmission signal from one self-powered wireless communication terminal is simultaneously received by one reader with the modulation scattering communication system, it is possible to avoid a reading failure caused by radio interference.

The wireless communication system according to the present invention may include an analysis means, two or more of the self-powered wireless communication terminals may be provided and the analysis means may identify, based on a mutual correlation function $C_{n,m}(\tau)=\int X_n(t-\tau)X_m(t)\,dt$ of observation waveform data $X_1(t)$, $X_2(t)$, . . . (here, t is an elapsed time) which is observed in each of the self-powered wireless communication terminals and which is received by the reader, the magnitude and the positional relationship of an event which causes the observation waveform data. In this case, for example, it is assumed that the vibration waveform of each of the four vehicle tire wheels (front wheels n=1, 2, rear wheels n=3, 4) is $X_n(t)$, while the vehicle is traveling on a road surface having projections and recesses, cracks, steps and the like, $C_{1,2}(0)$, $C_{3,4}(0)$, $C_{1,3}(\delta)$, $C_{2,4}(\delta)$ are monitored (here, $\delta$ is a time difference caused when the front wheels and the rear wheels pass the same point), with the result that it is possible to improve the efficiency of road maintenance management by linking with a car navigation system or the like.

The wireless communication system according to the present invention may include an analysis means, the rotation system may have a specific convex-concave pattern in a surface which makes contact with another structure and the analysis means may obtain, based on an autocorrelation function of observation waveform data which is observed in each of the self-powered wireless communication terminals and which is received by the reader or a mutual correlation function of the specific convex-concave pattern and the observation waveform data, rotation period information on the rotation system, information on a section in which the rotation system makes contact with the another structure and information on the height of the specific convex-concave pattern. In this case, for example, a specific convex-concave pattern such as an M-sequence is provided in the tire surface (surface which makes contact with the road), very slight vibrations which are produced with timing at which the tire surface makes contact with the road surface and with timing at which the tire surface is separated from the road surface are read from a vibration sensor, the timing at which the tire surface makes contact with the road surface and the timing at which the tire surface is separated from the road surface are extracted from an autocorrelation function or a mutual correlation function with the specific pattern such as the M-sequence which corresponds in period to the number of revolutions of the tire and thus it is possible to estimate a contact area with the tire from the time difference and the rotation period of the tire. Since it can be considered that the peak value of the autocorrelation function or the mutual correlation function with the specific pattern such as the M-sequence which corresponds in period to the number of revolutions of the tire reflects the wear state of the tire, it is possible to utilize it as a warning and the like for the replacement of the tire.

Advantageous Effects of Invention

According to the present invention, it is possible to provide a rotary system mounted piezoelectric generator which can be utilized by being directly mounted on a rotation system such as a tire and which can generate power in a wide range of numbers of revolutions with high efficiency. In the present invention, it is possible to provide a self-powered wireless communication teiniinal in which as a wireless communication means, subcarrier MPSK modulation scattering is used such that an extremely small amount of power is consumed and that radio interference is unlikely to be received and which can monitor a continuous vibration waveform and the like in real time, and a wireless communication system which uses such a self-powered wireless communication terminal. It is also possible to provide a self-powered wireless communication terminal and a wireless communication system which can monitor signals of ±both polarities of a vibration waveform by observing an alternating-current signal with a unipolar AD converter by offset AC coupling.

BRIEF DESCRIPTION OF DRAWINGS

FIG. 9(a) is a schematic diagram showing the rotation response locus of the weight and the centrifugal force and gravity acting on the weight when the vibration phase lag of the weight caused by the low-speed rotation does not occur, FIG. 9(b) is a schematic diagram showing the rotation response locus of the weight and the centrifugal force and gravity acting on the weight when the vibration phase lag of the weight caused by the rotation in the resonance state of the beam and the weight is 90° and FIG. 9(c) is a schematic diagram showing the rotation response locus of the weight and the centrifugal force and gravity acting on the weight when the vibration phase lag of the weight caused by the high-speed rotation is 180°;

DESCRIPTION OF EMBODIMENTS

An embodiment of the present invention will be described below based on examples.

Example 1

Figure 5:
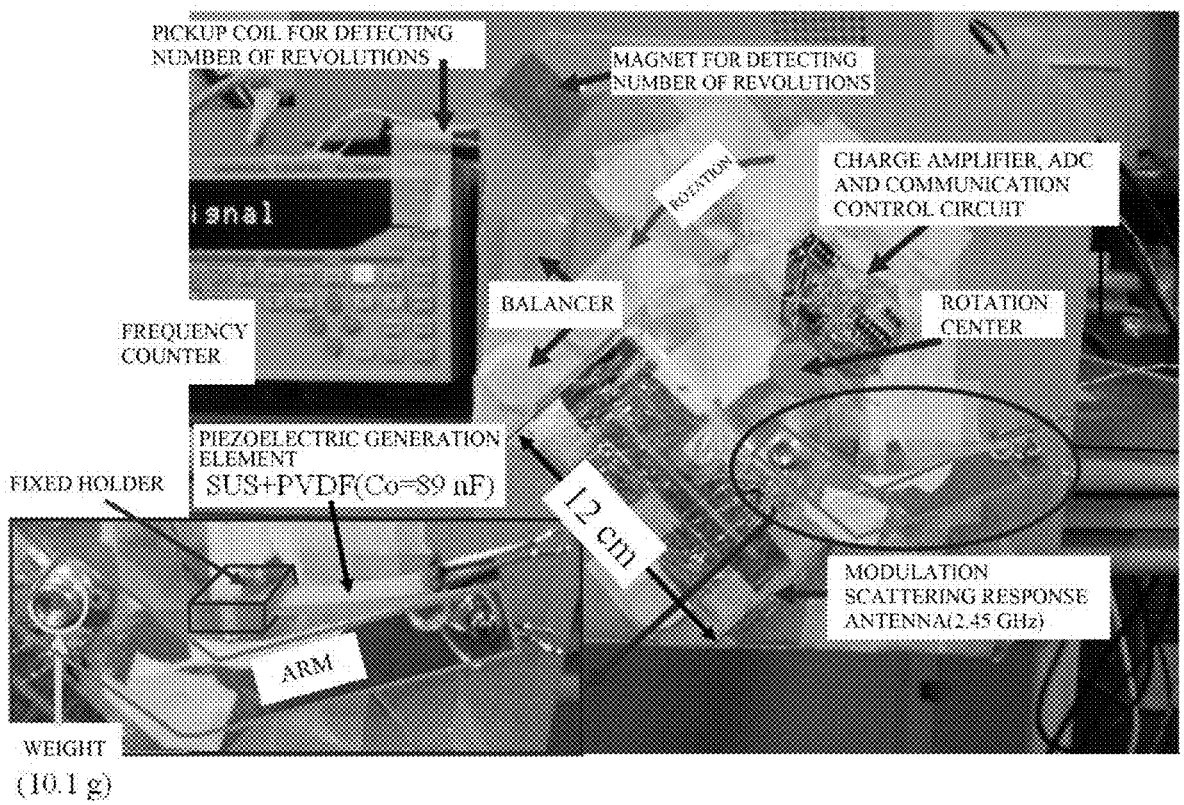
FIG. 5 is a photograph of an experimental device which is invented and produced experimentally in order to evaluate an example of a rotary system mounted piezoelectric generator in an embodiment using a folded beam of the present invention and a rotation response power generation amount.

In order to improve a decrease in the power generation amount of a conventional simple cantilever beam piezoelectric element in a rotation system, as an example of a rotary system mounted piezoelectric generator in the embodiment of the present invention, a folded weight loading-type piezoelectric generator is invented. FIG. 5 shows a photograph of the rotary system mounted piezoelectric generator and a rotation response power generation amount evaluation device. As shown in FIG. 5, the rotary system mounted piezoelectric generator has a reverse winding spring structure in which a weight is loaded at a tip end of a beam in a rotation drive direction when seen from a support point (fixed holder) at one end of the beam of a folded spring structure formed with a piezoelectric generation element and an arm. The rotary system mounted piezoelectric generator stores energy at the time of rotation acceleration, and decreases the rotation radius of the weight so as to reduce a centrifugal force whereas the rotary system mounted piezoelectric generator releases the energy at the time of steady rotation, and increases the rotation radius of the weight so as to increase the centrifugal force.

Here, preferably, the thickness of the spring material (SUS or steel) of the piezoelectric generation element falls within a range of equal to or more than 100 μm and equal to or less than 400 μm, and when as the piezoelectric material, a PVDF rolled film is used, its thickness is about several tens of micrometers whereas when an aluminum nitride thin film is used, its thickness is about several micrometers.

The rotation response power generation amount evaluation device shown in FIG. 5 converts, with a charge amplifier, a generation output charge from the rotary system mounted piezoelectric generator into a voltage, performs AD conversion on it, then uses a communication control circuit to digitally modulate it into a 50 kHz subcarrier QPSK signal, supplies it to an antenna for modulation scattering response to perform 2.45 GHz band wireless communication and thereby monitors a generation output waveform in real time. In this evaluation device, a magnet for detecting the number of revolutions, a pickup coil for detecting the number of revolutions and a frequency counter are used to simultaneously monitor the number of revolutions in an evaluation system.

Figure 6:
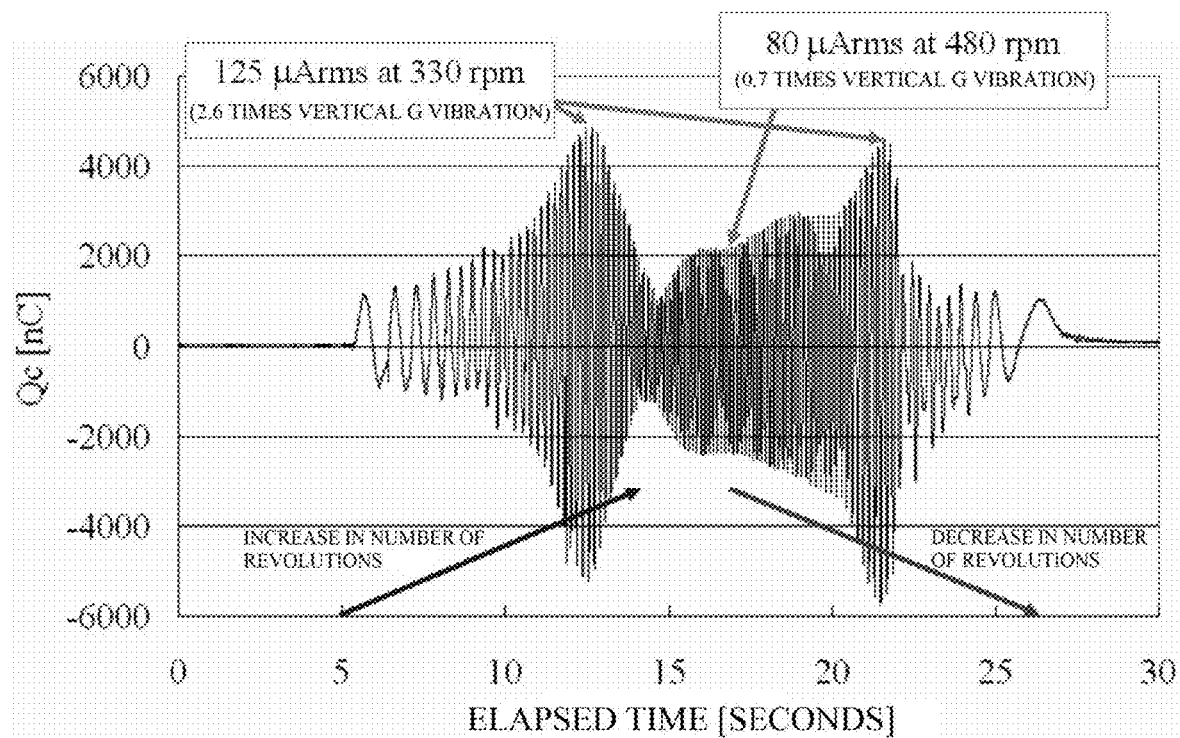
FIG. 6 is a graph showing a number of revolutions sweep time response by a rotation response power generation amount evaluation device shown in FIG. 5.

FIG. 6 shows the result of the evaluation by the rotation response power generation amount evaluation device shown in FIG. 5. In the graph of FIG. 6, with respect to an elapsed time t on the horizontal axis, a generation output charge of the rotary system mounted piezoelectric generator when the number of revolutions is increased and decreased and sweeping is performed is plotted as a waveform on the vertical axis. As shown in FIG. 6, around the elapsed time of t=12.5 seconds and t=22 seconds, the numbers of revolutions were both 330 rpm, and a piezoelectric element short-circuit current at that time was 125 μArms. This value is about 2.6 times the short-circuit current when a vertical vibration acceleration g=G at a nonresonant frequency of f=5.5 Hz shown in FIG. 1. In this way, it can be considered that the reverse winding spring structure of the rotary system mounted piezoelectric generator shown in FIG. 5 has the effect of modulating the centrifugal force applied to the weight by gravity (changing the rotation radius) to increase the vibration amplitude and thereby increasing the power generation amount.

Figure 4:
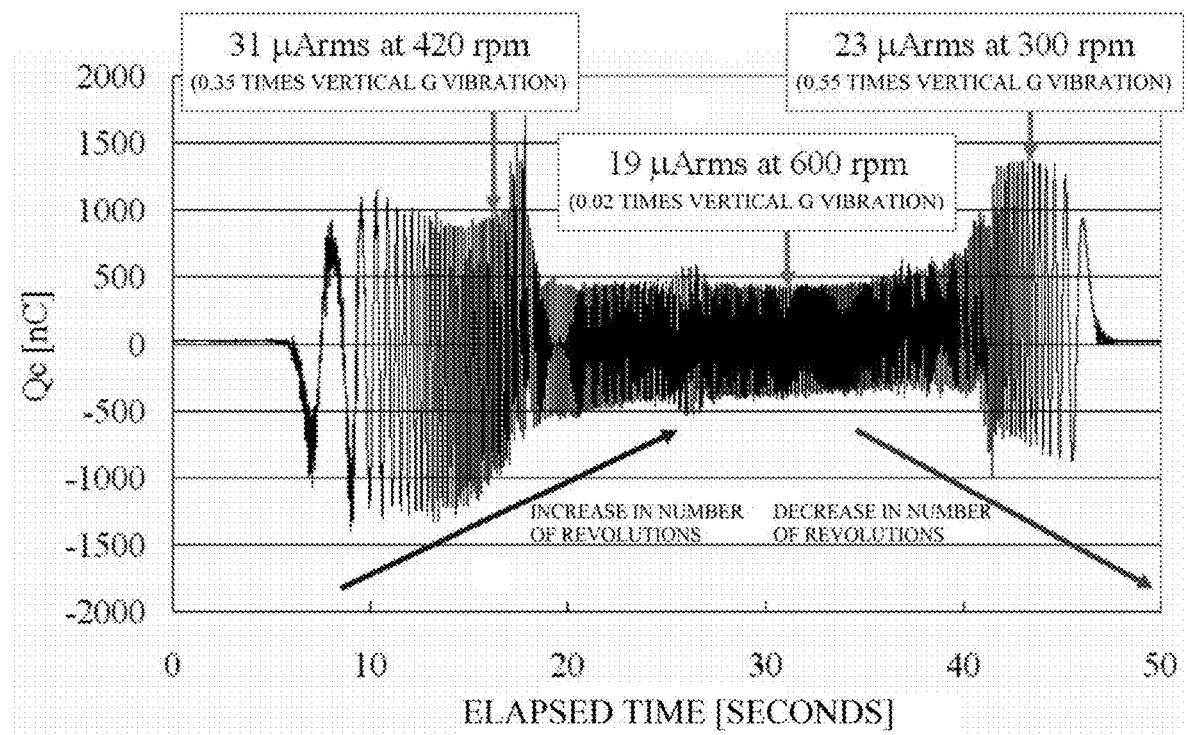
FIG. 4 is a graph showing the number of revolution sweep time response of the conventional simple cantilever beam piezoelectric generation element.

As shown in FIG. 6, around the elapsed time of t=17 seconds, the number of revolutions was 480 rpm, and the piezoelectric element short-circuit current at that time was 80 μArms. This value is about 0.7 times the short-circuit current when the vertical vibration acceleration g=G at a nonresonant frequency of f=8 Hz shown in FIG. 1. Although here, an increase in the vibration amplitude by the gravity modulation of the centrifugal force is not recognized, as compared with the conventional generation element shown in FIG. 4, about twice the element short-circuit current (about 4 times the amount of power generated) is obtained. As described above, it is found by comparison between FIGS. 6 and 4 that although in the rotary system mounted piezoelectric generator shown in FIG. 5, it can be recognized that a decrease in the vibration power generation amount tends to be caused by the centrifugal force in the rotation system, as compared with the conventional simple cantilever beam piezoelectric generator, it is possible to obtain a high power generation amount in a wide range of numbers of revolutions.

Figure 7:
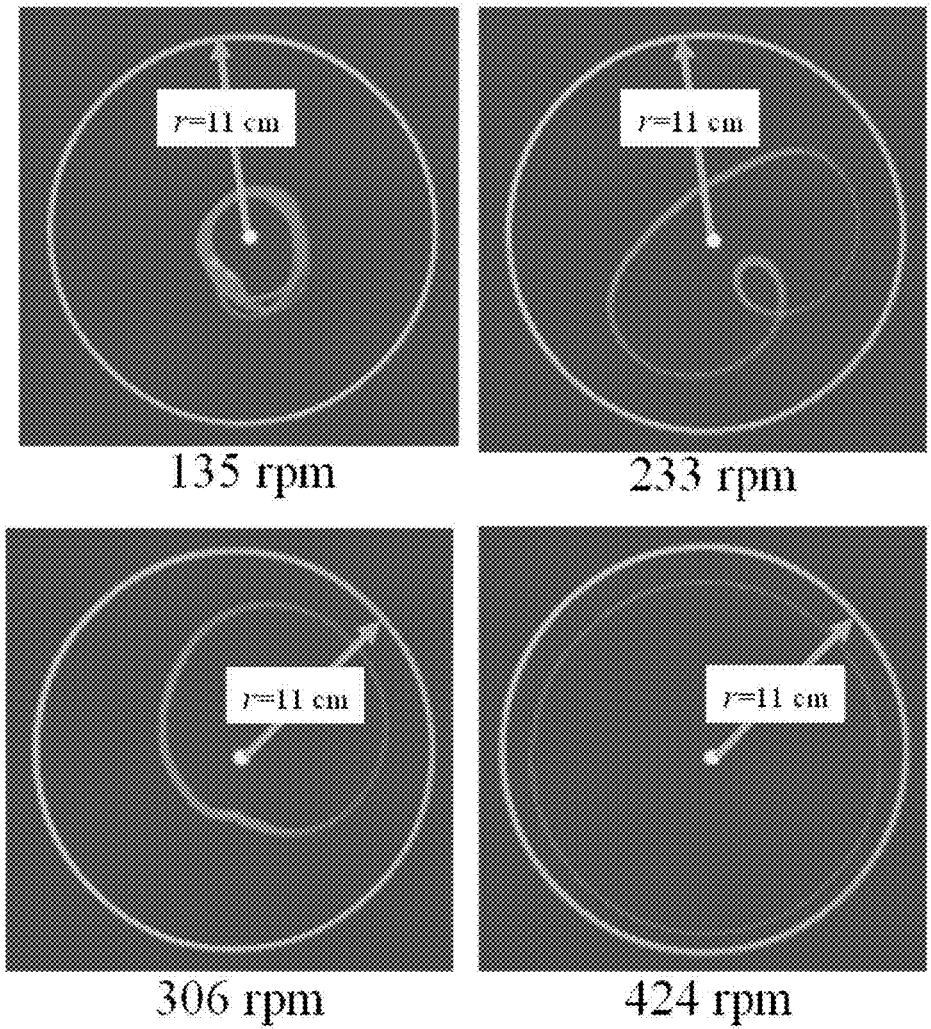
FIG. 7 is a photograph when the motion locus of a weight at each of various numbers of revolutions is observed in the rotary system mounted piezoelectric generator shown in FIG. 5.

FIG. 7 shows the motion locus of the weight at each of various numbers of revolutions in the rotary system mounted piezoelectric generator shown in FIG. 5. This figure shows the result of exposure shooting which is performed for 2 seconds at each of the numbers of revolutions while an orange LED is attached to the center of rotation, a green LED is attached to a position a radius r=11 cm away from the center of rotation, a red LED is attached to the weight and they are turned on. In this experiment, the waveform of a generation charge is also observed at the same time. Since the generation charge amount of the rotary system mounted piezoelectric generator is proportional to the amount of deformation of the beam, when the locus (red) of the weight is parallel to a true circle (green), power is no longer generated. In this way, in order to perform high-efficiency energy harvesting power generation, the vibration of the weight resulting from the vertical G modulates the centrifugal force, the motion locus of the weight is displaced from the true circle and thus an advantageous cooperative effect is produced. As shown in FIG. 7, it is found that the locus of the weight in the rotary system mounted piezoelectric generator is changed in a complicated manner depending on the numbers of revolutions. With respect to the waveforms of the generation charge at each of the numbers of revolutions, an unstable vibration with a small amplitude is output at 135 rpm, a two-tone sinusoidal vibration with a large amplitude is output at 233 rpm, a sinusoidal vibration with a large amplitude and a small amount of distortion is output at 306 rpm and a sinusoidal vibration with a medium amplitude is output at 424 rpm.

Figure 8:
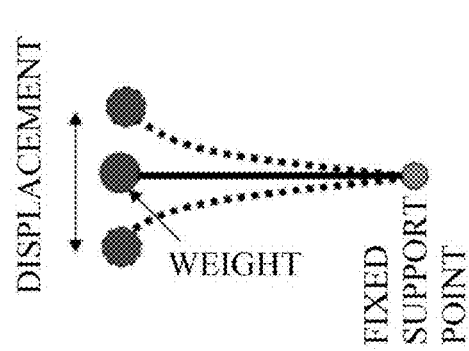
FIG. 8 shows the comparison of the degree of freedom of motion between a conventional simple cantilever beam and a folded spring beam in the embodiment of the present invention, and is front views of a case (a) where the beam is formed with the simple cantilever beam and a case (b) where the beam is formed with the folded spring beam.
Figure 8:
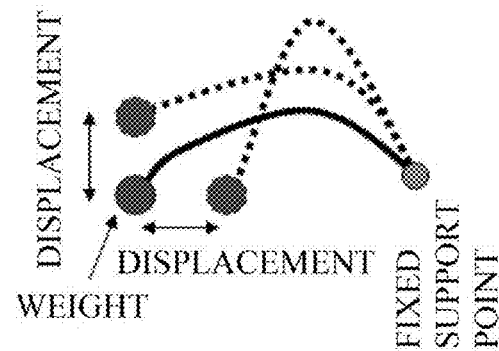

FIG. 8 is an example of the comparison of the degree of freedom of motion between a case where the beam structure used in the rotary system mounted piezoelectric generator is formed with the conventional simple cantilever beam and a case where the beam structure used in the rotary system mounted piezoelectric generator is formed with the folded spring beam in the embodiment of the present invention. The weight which is attached to the conventional simple cantilever beam in FIG. 8(*a*) has the degree of freedom of motion only in the up/down direction, and thus the weight cannot form a complicated rotation response locus as shown in FIG. 7. By contrast, the weight which is attached to the folded spring beam in the embodiment of the present invention has the degree of freedom of motion in the up/down direction and the left/right direction, and thus the weight can form the complicated rotation response locus as shown in FIG. 7.

Figure 9:
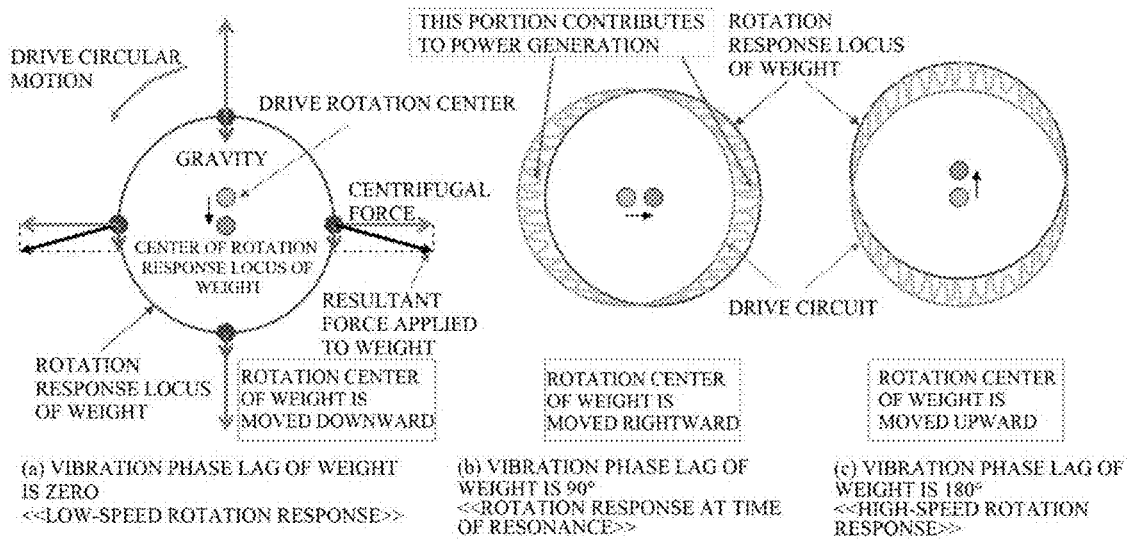
FIG. 9 is an illustrative diagram of operation principles which are simplified for indicating the power generation principles of the rotary system mounted piezoelectric generator in the embodiment of the present invention.

FIG. 9 is an illustrative diagram of operation principles which are simplified for indicating the power generation principles of the rotary system mounted piezoelectric generator in the embodiment of the present invention, and shows how the rotation response locus of the weight and the centrifugal force and gravity acting on the weight are operated. However, in this figure, in order for theoretical consideration to be simplified, the modulation effect of the centrifugal force by the vibration displacement of the weight is ignored. FIG. 9(a) shows a response when the rotation system is driven to rotate at a low speed, and when the weight is placed in an upward position, the gravity reduces the centrifugal force exerted on the weight whereas when the weight is placed in a downward position, the gravity enhances the centrifugal force exerted on the weight. Consequently, the center of the rotation response locus of the weight is moved downward from the rotation center of the rotation system. This corresponds to the response at the number of revolutions of 135 rpm in FIG. 7.

In FIG. 9(b), a case where the number of revolutions for drive at the frequency at which the beam formed with the weight and the spring resonates is provided is assumed. Since the vibration displacement response of the weight at the resonant frequency lags in phase by 90° with respect to the applied acceleration vibration, in the case of a counterclockwise drive rotation system, the center of the rotation response locus of the weight is moved rightward from the rotation center. In FIG. 9(c), a case where the number of revolutions for high-speed drive exceeding the resonant frequency is provided is assumed. Since in this case, the vibration displacement response of the weight lags in phase by 180° with respect to the applied acceleration vibration, the center of the rotation response locus of the weight is moved upward from the rotation center.

Here, the response at the number of revolutions of 306 rpm in FIG. 7 corresponds to the intermediate between FIG. 9(b) and FIG. 9(c). Although the response at the number of revolutions of 233 rpm in FIG. 7 corresponds to the intermediate between FIG. 9(a) and FIG. 9(b), it can be considered that it is impossible to give a description when the modulation effect of the centrifugal force by the vibration displacement of the weight is ignored. It can be considered that in the response at the number of revolutions of 424 rpm in FIG. 7, the spring is almost stretched by the centrifugal force of the high-speed rotation so as to be hardened, that the resonant frequency of the weight and the spring is increased and that the conditions are returned to the conditions of FIG. 9(a). It can be considered that as shown in FIG. 9, the amount of displacement of the rotation response of the weight from the drive true circle per unit time determines the power generation amount of the piezoelectric generation element.

Figure 10:
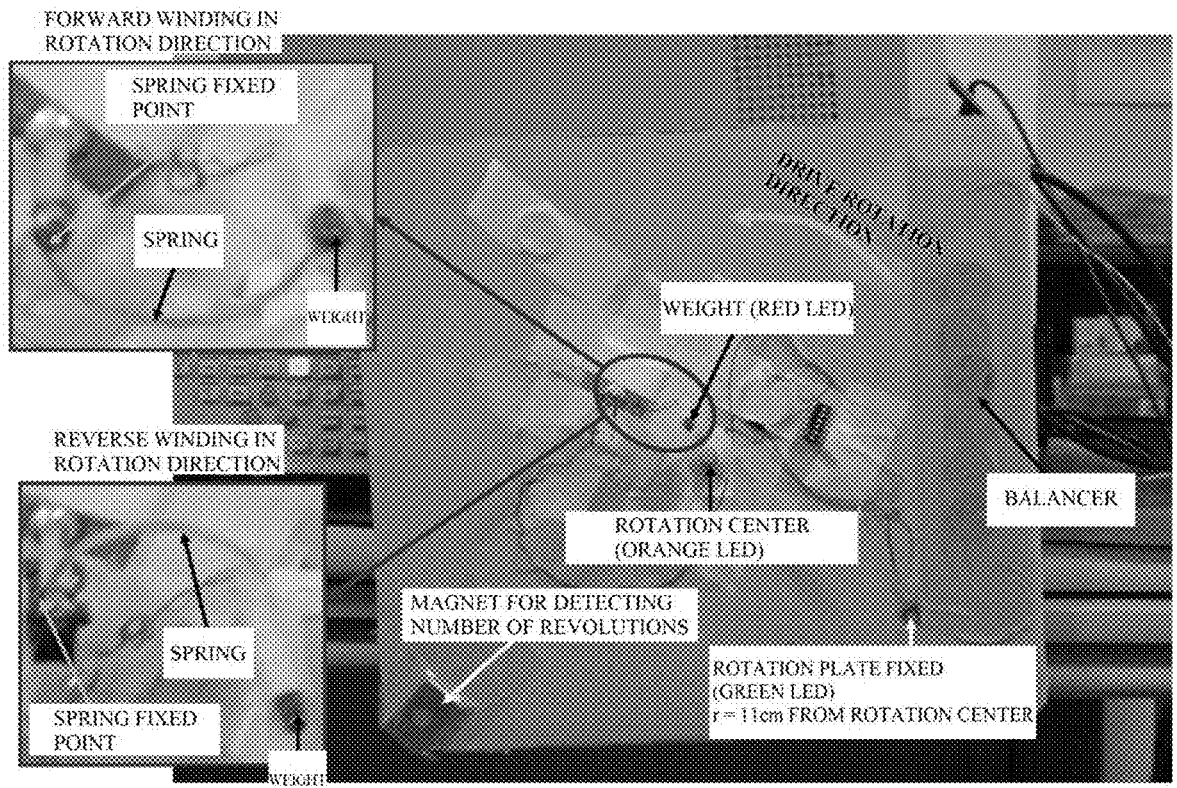
FIG. 10 is a photograph of an experimental device for comparing the rotation motion locus of the weight between a case where the beam is formed with a forward winding spring and a case where the beam is formed with a reverse winding spring in order to check effects produced by differences of the winding shape of the beam and a drive rotation direction in an example of the rotary system mounted piezoelectric generator using the spiral beam in the embodiment of the present invention.
Figures 11, 12:
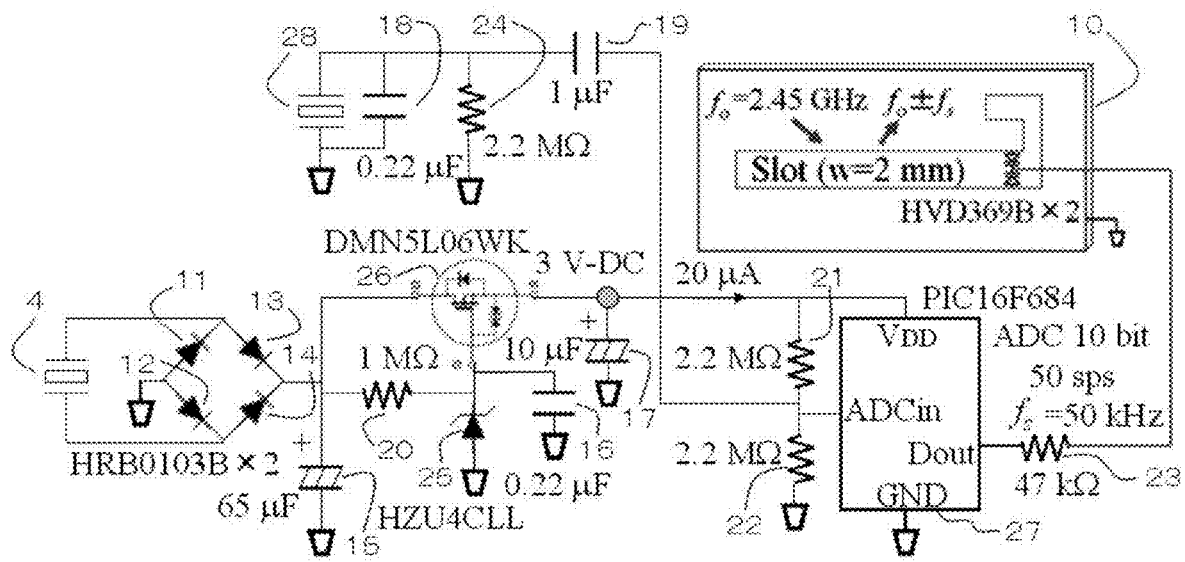
FIG. 11 is photographs when the motion locus of the weight at each of various numbers of revolutions is observed with the experimental device shown in FIG. 10.
FIG. 12 is a circuit diagram showing the configuration of a self-powered wireless communication terminal in the embodiment of the present invention.

FIGS. 10 and 11 respectively show an experimental device and the result of an experiment when the rotation motion locus of the weight is compared between a case where the beam is formed with a forward winding spring in the drive rotation direction and a case where the beam is fonned with the reverse winding spring in the drive rotation direction. In this experiment, as the folded beam of the rotary system mounted piezoelectric generator in the embodiment of the present invention, a spiral structure arranged on a plane perpendicular to the rotation shaft of the drive rotation system is used. It is found from the result of the experiment of FIG. 11 that the case of the forward winding spring indicates that the radius of the response locus is simply increased by the increase in the centrifugal force as the number of revolutions is increased whereas the case of the reverse winding spring indicates that the response locus shape is changed in a complicated manner as the number of revolutions is changed. As shown in FIG. 10, both in the cases of the forward winding spring and the reverse winding spring, the position of the weight at rest is almost on a line connecting the spring fixed point and the rotation center, and at the time of rotation acceleration, in the case of the forward winding spring, the weight receives a force acting in a direction in which the spring is rewound and thus the rotation radius of the weight is little changed whereas in the case of the reverse winding spring, the weight receives a force acting in a direction in which the spring is wound so as to increase the rotation radius of the weight and thus a greater centrifugal force is produced. It can be considered that as described above, as the modulation effect of the centrifugal force by the vibration displacement of the weight is enhanced, the vibration displacement of the weight is amplified and thus it is possible to obtain a higher power generation amount. Even in the case of the forward winding spring, the position of the weight is adjusted to be sufficiently separated from the line connecting the spring fixed point and the rotation center such that the rotation radius of the weight is increased at the time of rotation acceleration, and thus it is possible to obtain the same effect as in the reverse winding spring. As described above, as the folded beam of the rotary system mounted piezoelectric generator in the embodiment of the present invention, the spiral structure is used, and thus it is possible to obtain a higher power generation output in a wider range of numbers of revolutions.

Figure 1:
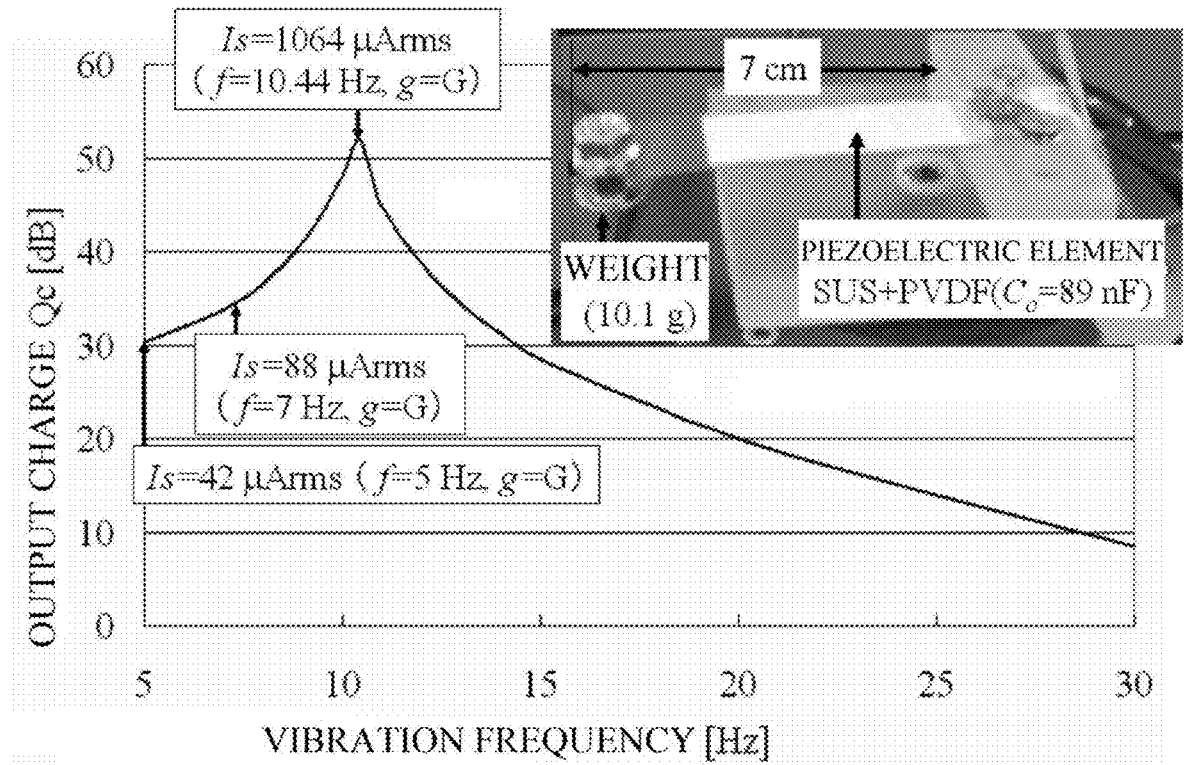
FIG. 1 is a photograph of a conventional simple cantilever beam piezoelectric generation element and a graph showing a vertical vibration frequency response power generation amount.
Figure 2:
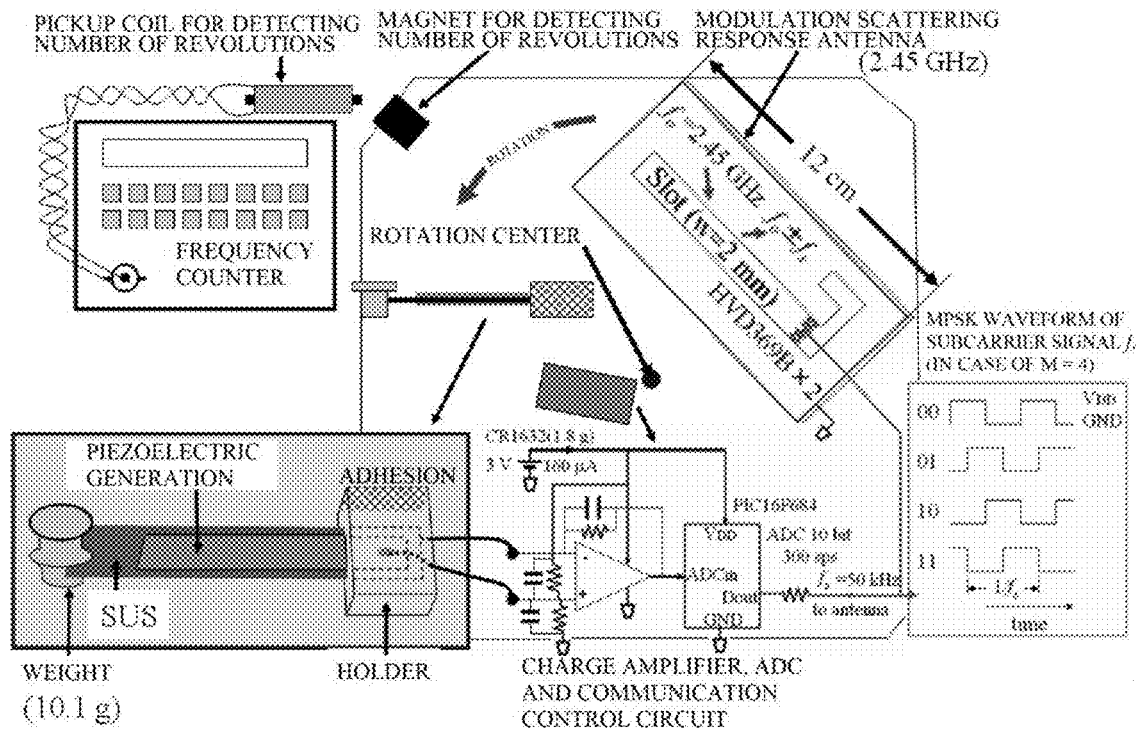
FIG. 2 is a block diagram showing the structure of an experimental device invented and produced experimentally in the present invention in order to evaluate the conventional simple cantilever beam piezoelectric generation element and its rotation response power generation amount.

Although in FIG. 8(b), two dimensions in the up/down direction and the left/right direction on the degree of freedom of motion of the weight attached to the beam firmed with the folded spring are described, as a means for fixing one end of the folded beam to the rotation system, an inclination movable spring structure is used, thus it is possible to add a torsion mode to the degree of freedom of motion of the weight attached to the other end of the folded beam, three-dimensional motion can be performed and a more complicated motion locus of the weight is obtained, with the result that it is possible to obtain a large amount of power from the piezoelectric generation element in a wider range of numbers of revolutions. The rotation response locus of the weight of the reverse winding spring at 360 rpm in FIG. 1 is an example of the rotation response in a torsion vibration mode.

Example 2

Figure 13:
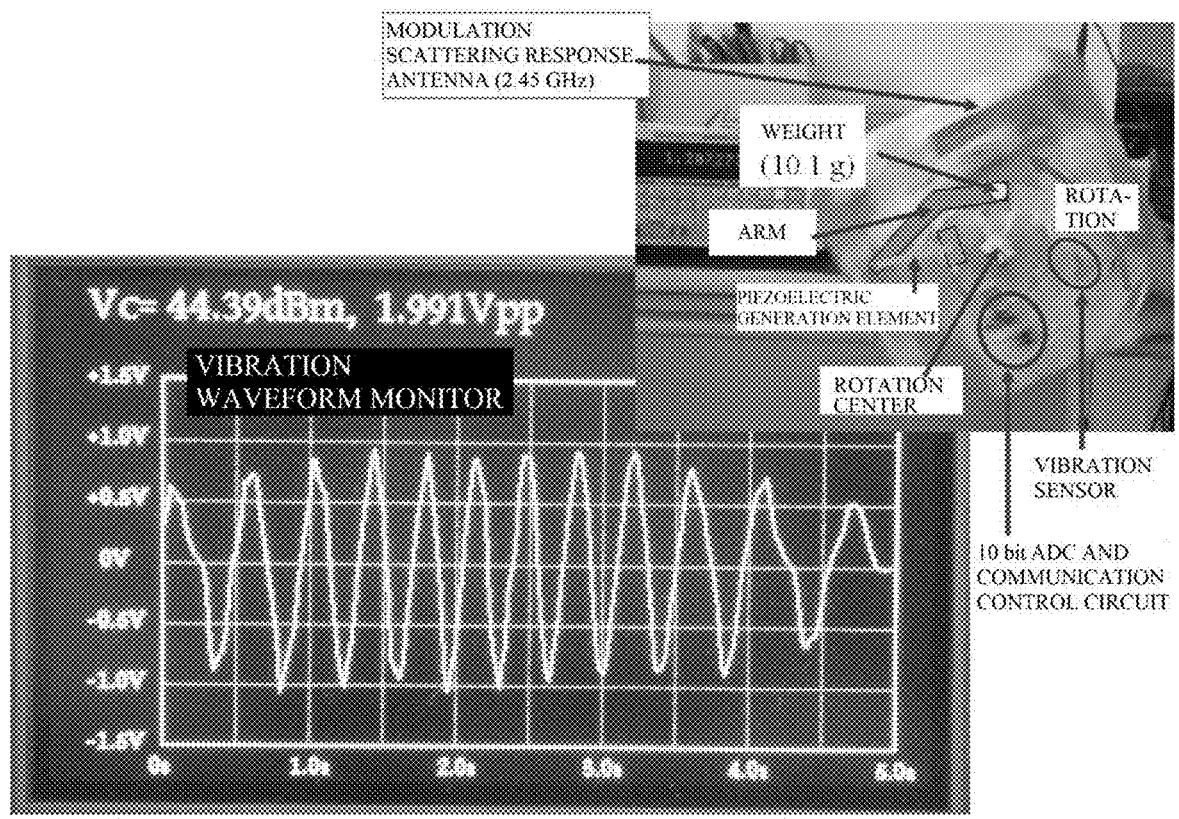
FIG. 13 is photographs of the rotary system mounted piezoelectric generator in the embodiment of the present invention and the self-powered wireless communication terminal shown in FIG. 12 and a graph showing an example of the result of rotation vibration waveform monitoring.

FIGS. 12 and 13 show examples of the circuit diagram of the self-powered wireless communication terminal in the embodiment of the present invention using the rotary system mounted piezoelectric generator having the folded beam structure and an evaluation experiment thereof. Here, the piezoelectric generation element 4 of FIG. 12 is loaded on the beam formed with the folded spring in which one end is fixed to the drive rotation system and in which the weight is attached to the other end. Alternating-current power which is generated in the piezoelectric generation element 4 by the rotation motion is rectified by a bridge (HRB0103B×2) formed with rectifier diodes 11 to 14, is stored in a capacitor 15, is stabilized into a direct-current voltage of 3V by a MOSFET (DMN5L06WK) 26 and is supplied as power to the microcontroller (PIC16F684) which performs AD conversion and subcarrier MPSK modulation.

A piezoelectric acceleration sensor 28 attached to the drive rotation system is formed of a piezoelectric material such as PVDF which has a relatively low dielectric constant and which has a high conversion linearity from acceleration into voltage, and a sensor output voltage thereof is connected to the AD conversion input of a controller 27 through an AC coupling capacitor 19 of 1 μF. Here, since an AD converter which is incorporated in the controller 27 used is operated with a unipolar power supply, and an input voltage falls within a range of 0 to VDD, an alternating-current sensor output voltage is offset only by +VDD/2 with resistors 21 and 22, and the AD conversion is performed. A capacitor (0.22 μF) 18 and a resistor (2.2 MΩ) 24 which are connected parallel to the piezoelectric sensor 28 are inserted in order to adjust the sensitivity and the low frequency response cutoff frequency of the piezoelectric sensor 28. In the controller 27 which is operated as the wireless communication means, software (see patent literature 2) for wireless transmitting AD conversion data is installed, a modulation scattering response antenna 10 is controlled with an output signal from Dout and thus the AD conversion data is wirelessly transmitted.

FIG. 13 shows an example of the operation of the self-powered wireless communication terminal shown in FIG. 12, and power which is consumed by the AD conversion with a resolution of 10 bits at a rate of 50 sps and the wireless communication is 3V−DC×20 μA. In the case of the rotary system mounted piezoelectric generator having the folded beam structure shown in FIG. 13, it was possible to continuously and wirelessly monitor the vibration waveform in a range of the numbers of revolutions from 100 rpm to 600 rpm. The distance over which wireless reading was able to be performed with the self-powered wireless communication terminal was about 3 m when an RF output on the side of a reader was set to 10 μW and was about 30 m when it was set to 100 mW.

Figure 14:
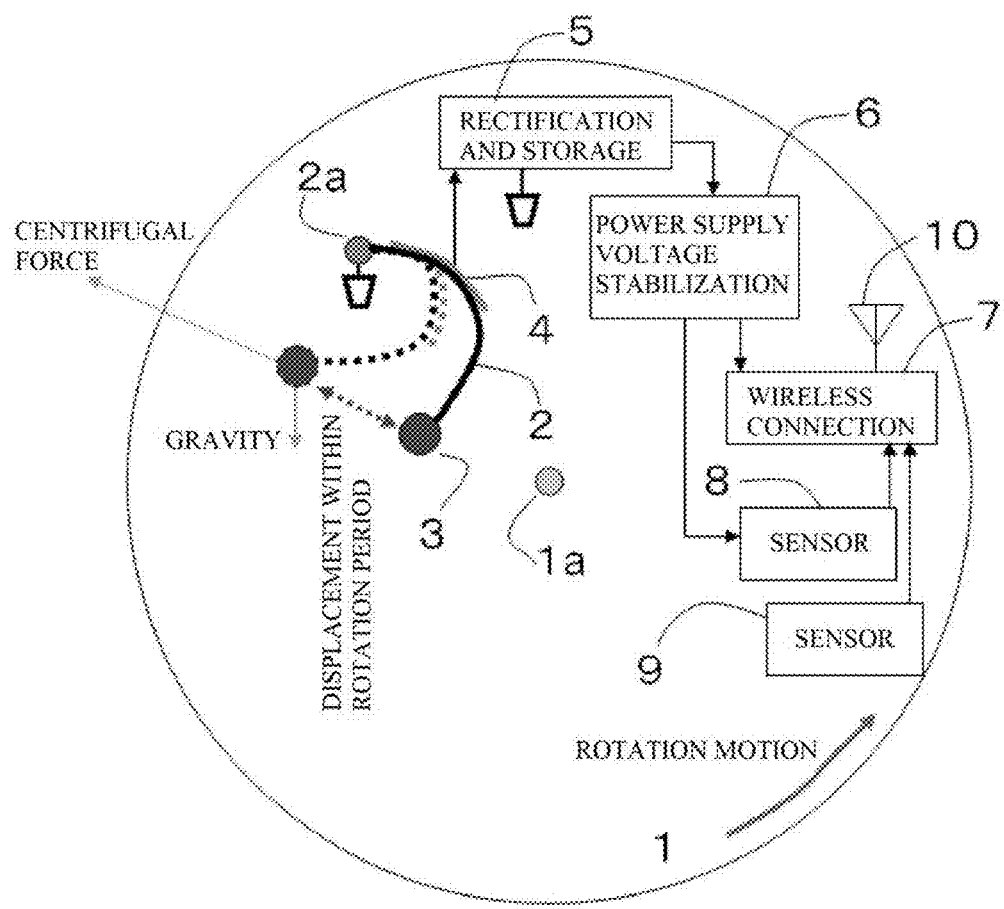
FIG. 14 is a configuration diagram showing the rotary system mounted piezoelectric generator in the embodiment of the present invention and the self-powered wireless communication terminal using it.

FIG. 14 shows the configurations of the rotary system mounted piezoelectric generator having the spiral beam structure in the embodiment of the present invention and the self-powered wireless communication terminal which uses it. The rotary system mounted piezoelectric generator has a structure in which part or the whole of the spiral spring 2 is formed with the piezoelectric generation element 4, one end of the spring 2 is fixed to the drive rotation system 1 at the fixed support point 2a of the spring, the weight 3 is provided at the other end and the weight 3 can be freely moved. When the drive rotation system 1 is driven to rotate, and the rotary system mounted piezoelectric generator receives, as a force applied to the weight 3, not only a centrifugal force but also a second force such as gravity, as in the result of the experiment shown in FIGS. 10 and 11, by the utilization of a large amount of displacement of the motion locus of the weight 3 from the true circle with a drive rotation motion center 1a in the center, it is possible to obtain a large amount of power from the piezoelectric generation element 4 over a wide range of numbers of revolutions.

Here, a description will be given of an optimum power generation value in a case where the direction of the weight 3 in the spiral spring 2 when seen from the fixed support point 2a of the spring with respect to the drive rotation direction is the reverse winding spring beam structure and an optimum power generation value in a case where it is the forward winding spring beam structure. It was confirmed from an experiment that when the arc-shaped spring 2 having a diameter on a line connecting the fixed support point 2a of the spring and the drive rotation center 1a is assumed, in the case of the reverse winding spring beam, the arc length is the optimum at 225° with respect to the reverse rotation direction whereas in the case of the forward winding spring beam, the arc length is the optimum at 135° with respect to the rotation direction.

As the means for fixing one of the spiral spring to the drive rotation system 1 at the fixed support point 2a of the spring, the inclination movable spring structure is used so as to increase the degree of freedom of motion of the weight 3 attached to the other end of the spring 2, a vibration mode is added and thus it is possible to obtain a more complicated motion locus of the weight 3, with the result that it is also possible to obtain a large amount of power from the piezoelectric generation element 4 in a wider range of numbers of revolutions.

In the rotation system installed horizontally, even when it is impossible to obtain the vibration of the weight 3 by gravity, a magnet arranged outside the drive rotation system 1 is used to provide a second force, a vibration is produced by a variation in magnetic force received by the weight 3 resulting from the rotation and a centrifugal force exerted on the weight 3 is modulated to amplify the vibration of the weight 3 resulting from the magnetic force, with the result that it is also possible to obtain a larger amount of power generated.

Moreover, a wall is partially arranged outside the drive rotation system 1 in order to obtain air resistance, by the utilization of a variation in fluid resistance as the second force, a vibration is produced by a variation in fluid resistance received by the weight 3 resulting from the rotation and a centrifugal force exerted on the weight 3 is modulated to amplify the vibration of the weight 3 resulting from the fluid resistance, with the result that it is also possible to obtain a larger amount of power generated.

Incidentally, alternating-current power obtained in the rotary system mounted piezoelectric generator of FIG. 14 is rectified and stored with a rectification and storage means 5 which is formed with the rectifier diodes 11 to 14 and the capacitor 15 so as to correspond to FIG. 12, is stabilized into direct-current power with a power supply voltage stabilization means 6 which is formed with capacitors 16 and 17, a resistor 20, a constant voltage diode 25 and a MOSFET 26 and is supplied as power to a wireless connection control means 7 which is formed with the microcontroller 27 and the resistors 21 and 22 and a sensor 8 which needs to have a drive power supply. The output of the wireless connection control means 7 is connected to the modulation scattering response antenna 10, and thus sensor information is wirelessly transmitted. The sensor 8 which needs to have a drive power supply is specifically a temperature or pressure sensor, and a sensor 9 which does not need to have a drive power supply is formed with the piezoelectric acceleration sensor, the capacitors 18 and 19 and the resistor 24 and is connected to the wireless connection control means 7.

As the wireless connection control means 7, a subcarrier multilevel phase-shift keying (MPSK) modulation scattering communication system is used, and thus as compared with a conventional active-type wireless connection means, it is possible to reduce power to one hundredth or less as power saving, even in self-sustaining power generation, it is possible to monitor a continuous waveform, excellent noise-resistant properties are provided and it is also possible to perform simultaneous reading from a plurality of readers.

Figure 15:
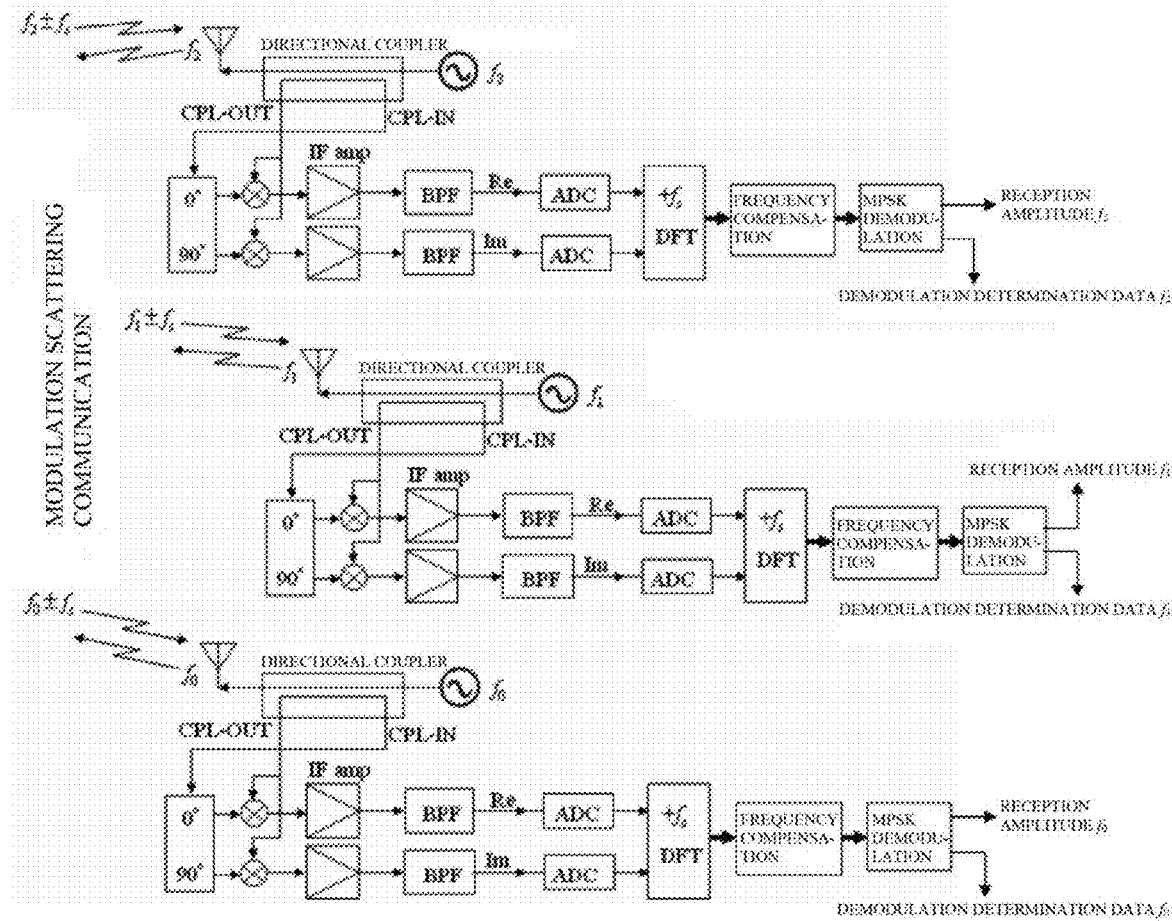
FIG. 15 is a block configuration diagram showing a reader in a wireless communication system for the self-powered wireless communication terminal in the embodiment of the present invention.

FIG. 15 shows an example of the configuration of a reader in the wireless communication system for the self-powered wireless communication terminal of FIG. 14. The modulation scattering response antenna 10 of the self-powered wireless communication terminal of FIG. 14 is a soft thin cavity backed slot antenna shown in FIG. 5, is mounted on a cylindrical portion of a tire wheel and performs modulation scattering communication with linearly polarized waves. The reader antennas of FIG. 15 for $f_0$, $f_1$ and $f_2$ in linearly polarized waves are provided at intervals of about 120° around the tire on a vehicle body, and they each receive modulation scattering signals from the modulation scattering response antenna 10 of the self-powered wireless communication terminal at different inquire frequencies.

Figure 16:
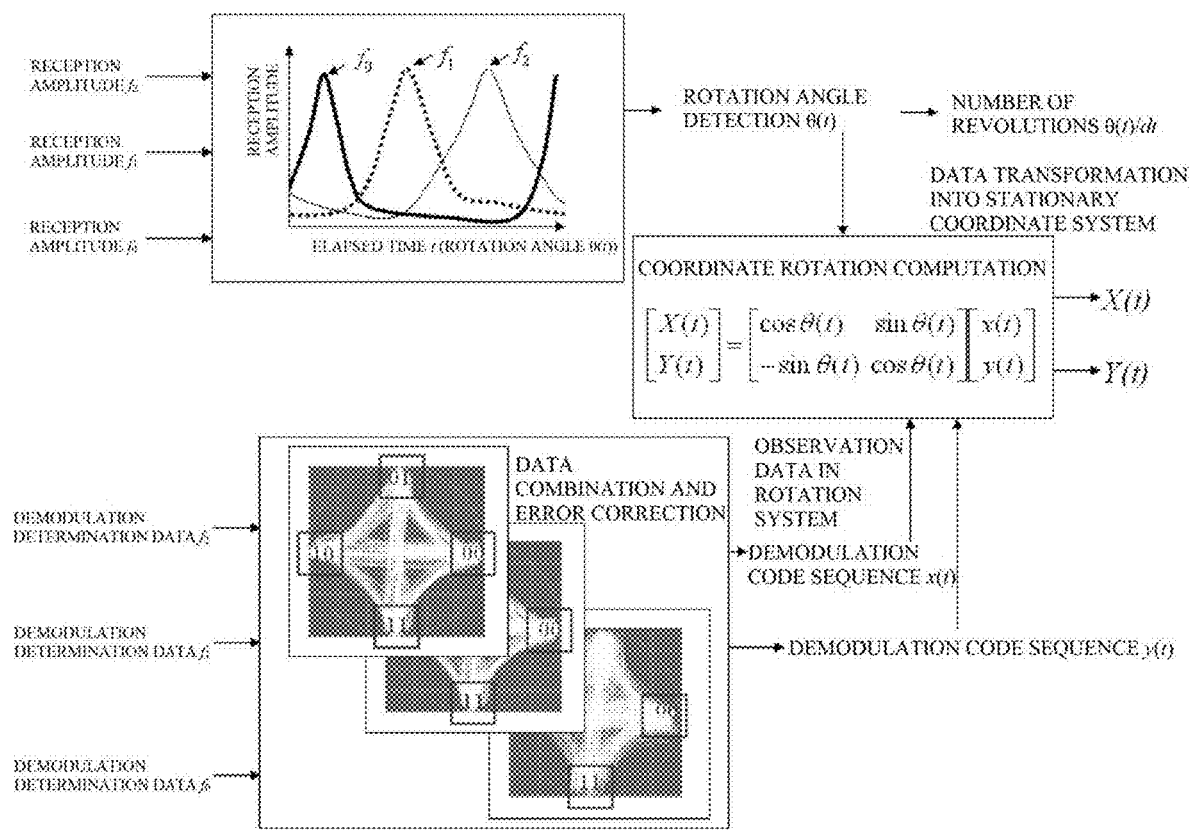
FIG. 16 is an illustrative diagram showing an example of the operation of the wireless communication system shown in FIG. 15.

FIG. 16 shows an example of the operation of the wireless communication system for the self-powered wireless communication terminal, the reader outputs reception amplitude values and demodulation determination data for $f_0$, $f_1$ and $f_2$, the relative positions of the reader antennas and the modulation scattering response antenna 10 of the self-powered wireless communication terminal are estimated from timing at which the maximum value of each of the reception amplitudes is obtained and the instantaneous value $\theta(t)$ of a tire rotation angle is obtained. As shown in FIG. 16, for the demodulation determination data of MPSK, as an individual code determination area (error outside the range of □ in 00, 01, 10, 11), maximum likelihood estimation (diversity reception) is performed on a reception code and an observation data demodulation code sequence x(t), y(t) in the drive rotation system 1 is output. In this system, the evaluation of the rotation angle $\theta(t)$ with respect to the sensing data x(t), y(t) in the drive rotation system 1 and the monitoring function of the number of revolutions $\theta(t)/dt$ are provided, and for example, it is possible to evaluate the correlation function of the rotation position, the vibration waveform and the like of the sensor 8, such as a pressure sensor, which needs to have a drive power supply and the sensor 9, such as a piezoelectric acceleration sensor, which does not need to have a drive power supply. In this way, sensor vector data [x(t), y(t)] of a two-axis acceleration observed by the eccentricity monitoring of the drive rotation system 1 or the drive rotation system 1 is subjected to rotational coordinate transformation at a detection rotational angle, and thus it is also possible to evaluate the sensor vector data [x(t), y(t)] in a stationary coordinate system.

Example 3

Specific examples of the rotary system mounted piezoelectric generator in the embodiment of the present invention, the self-powered wireless communication terminal which uses it and the wireless communication system for the self-powered wireless communication terminal will be described below.

(1) Intelligent Tire System

As the sensor 8 which needs to have a drive power supply and which is shown in FIG. 14, the self-powered wireless communication terminal which incorporates an air pressure sensor and a temperature sensor is mounted on the wheel of a vehicle tire serving as the drive rotation system 1, and each piece of sensor information is read in real time with the reader shown in FIG. 15. Although information on the air pressure and the temperature is also utilized by a conventional TPMS, and it can be utilized as a warning for a tire burst, since in the self-powered wireless communication terminal, as compared with a conventional observation sampling interval (about 5 minutes), its observation sampling interval is sufficiently short (about 300 times per second), and continuous observation can be performed, it is also possible to provide a warning for a very small amount of deformation of a tire, a rapid change in the temperature of the tire or the like from a correlation between a variation in the air pressure of the tire and the rotation angle of the tire.

Since as shown in FIG. 16, it is possible to obtain, from the acceleration sensor information mounted on the tire, the acceleration information in the stationary coordinate system, by comparison with the acceleration sensor information installed on the vehicle body, it is possible to evaluate the sliding, the vibration and the stress of the tire, with the result that it is possible to apply it not only to a danger warning but also to operation assist control for vehicle travel.

Furthermore, since the tire can directly monitor road surface information without intervention of the suspension of the vehicle, it is assumed that the vibration waveform of each of the four wheels (front wheels n=1, 2, rear wheels n=3, 4) is $X_n(t)$, a mutual correlation function $C_{n,m}(\tau)=\int X_n(t-\tau) X_m(t) dt$ is calculated while traveling, and projections and recesses, cracks, steps and the like in the road surface are monitored with $C_{1,2}(0)$, $C_{3,4}(0)$, $C_{1,3}(\delta)$, $C_{2,4}(\delta)$, with the result that it is possible to improve the efficiency of road maintenance management by linking with a car navigation system.

However, $\delta$ is assumed to be a time difference caused when the front wheels and the rear wheels pass the same point, and the computation of the correlation function may be not a convolution integral but the inverse Fourier transform of a cross spectrum, and in this case, it is possible to mask the cross spectrum in order to cancel out the influence of a response or the like caused by the rotation period of the tire.

A specific convex-concave pattern such as an M-sequence is provided in the tire surface (surface which makes contact with the road), very slight vibrations which are produced with timing at which the tire surface makes contact with the road surface and with timing at which the tire surface is separated from the road surface are read from an acceleration sensor, the timing at which the tire surface makes contact with the road surface and the timing at which the tire surface is separated from the road surface are extracted from an autocorrelation function or a mutual correlation function with the specific pattern such as the M-sequence which corresponds in period to the number of revolutions of the tire and thus it is possible to estimate a contact area with the tire from the time difference and the rotation period of the tire. Since the peak value of the autocorrelation function or the mutual correlation function with the specific pattern such as the M-sequence which corresponds in period to the number of revolutions of the tire reflects the wear state of the tire, it is possible to utilize it as a warning for the replacement of the tire.

Example 4

(2) Monitoring of Belt Conveyor

Figure 3:
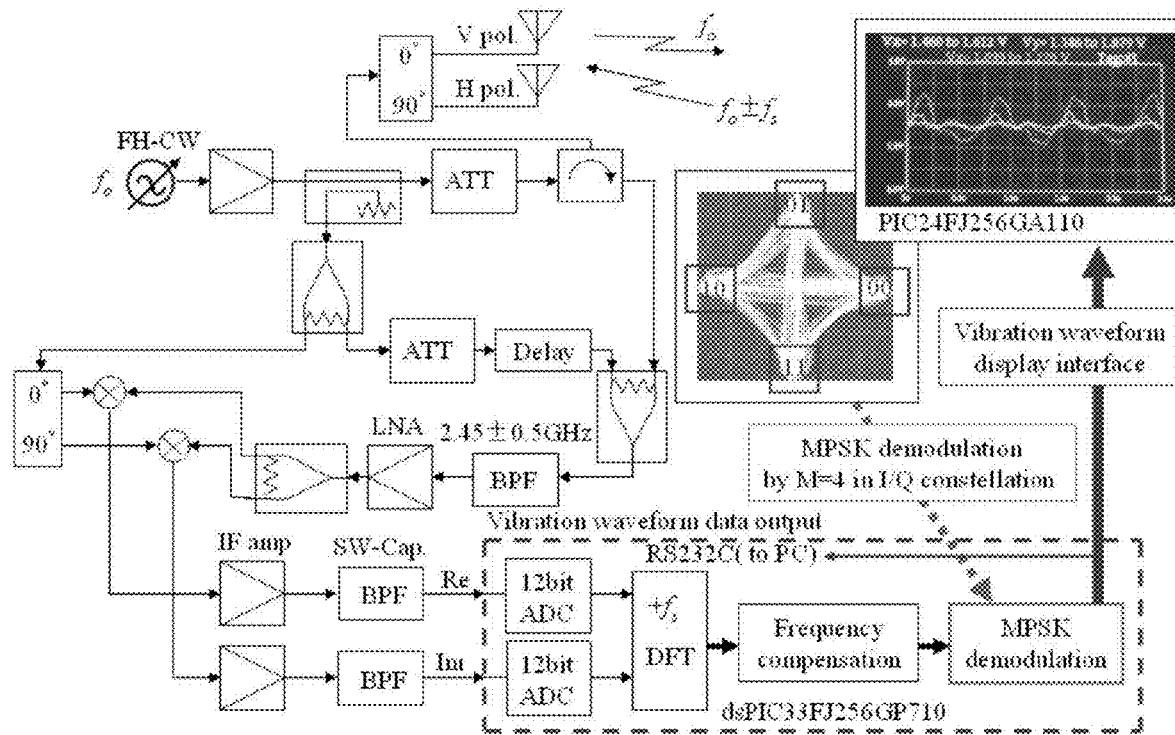
FIG. 3 is a block diagram showing the structure of a wireless receiving device invented in the present invention in order to monitor the rotation response power generation amount in the experimental device shown in FIG. 2.

Since a transport target is not constant for a belt conveyor, a device may be damaged such as by abnormal resonance and the like depending on load conditions. The self-powered wireless communication terminal which incorporates a piezoelectric vibration sensor as the sensor 9 that does not need to have a drive power supply and which is shown in FIG. 14 is mounted on the roller and pulley of a belt conveyor, and vibration waveform information is obtained with the receiving device for wireless vibration waveform monitoring shown in FIG. 3. A determination as to whether the vibration is a partially local vibration or abnormal resonance which leads to a damage of the device is made from the correlation function of the vibration waveforms at a plurality of installation points and the result of a frequency spectrum analysis, a warning is provided and it is also possible to control the transport speed in order to avoid a resonance phenomenon.

Example 5

(3) Monitoring of Large Windmill

Figure 17:
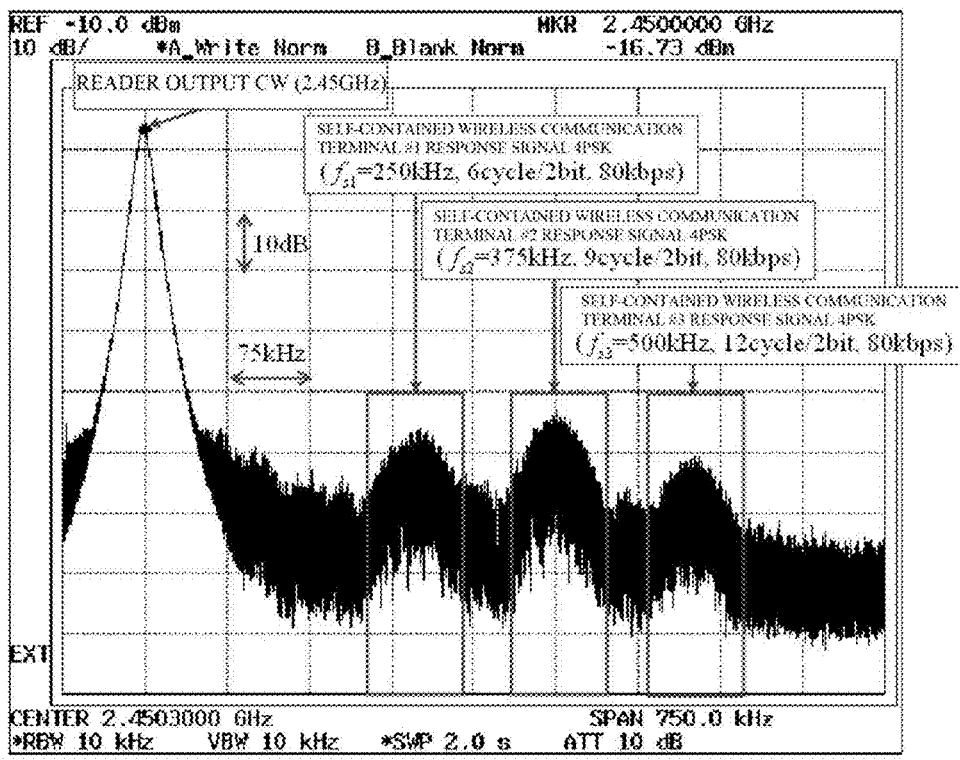
FIG. 17 shows an example of an experiment which is performed for simultaneously communicating the vibration waveforms of the individual blades of a windmill for wind power generation by the frequency multiplexing of subcarrier signals with the self-powered wireless communication terminal in the embodiment of the present invention.
Figure 18:
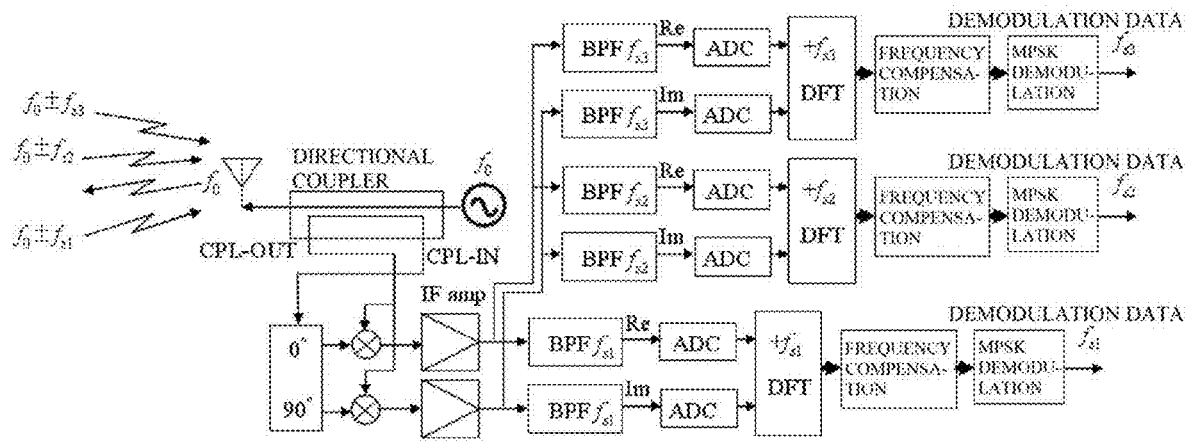
FIG. 18 is a block diagram showing the configuration of a reader device for performing the simultaneous communication by the frequency multiplexing of subcarrier signals shown in FIG. 17.

In a large windmill for wind power generation, there is a danger that not only a blade may be damaged but also a tower may collapse due to abnormal resonance of the blade. The self-powered wireless communication terminal which incorporates the piezoelectric vibration sensor as the sensor 9 that does not need to have a drive power supply and which is shown in FIG. 14 is mounted on each blade of the windmill, and the vibration waveform of each blade is monitored. Here, as shown in FIG. 17, subcarrier signal frequencies $f_s$ are set to different frequencies $f_{S1}$, $f_{S2}$ and $f_{S3}$ such that wireless transmission signals from the individual blades are not overlapped, and the vibration waveforms of the blades are simultaneously monitored with a reader device shown in FIG. 18. A determination as to whether or not the vibration is abnormal resonance which leads to a damage is made from the monitored vibration waveforms, a warning is provided and it is also possible to control the angle of each blade in order to avoid a resonance phenomenon.

INDUSTRIAL APPLICABILITY

According to the present invention, it is possible to obtain a rotary system mounted piezoelectric generator which is mounted on a rotation system such as a vehicle tire, which converts part of rotational energy into electrical energy with a piezoelectric element, which uses the electrical energy to measure information on the vibration, the temperature, the pressure and the like of the mounted rotation system and which performs monitoring by wireless communication from the outside, a self-powered wireless communication terminal which uses it and a wireless communication system, with the result that the present invention contributes to the development of the automobile industry and industrial equipment related industries.

REFERENCE SIGNS LIST 1 drive rotation system
   1a center of drive rotation
2 spring
   2a fixed support point of spring
3 weight
4 piezoelectric generation element
5 rectification and storage means
6 power supply voltage stabilization means
7 wireless connection control means
8 sensor which needs to have a drive power supply
9 sensor which does not need to have a drive power supply
10 modulation scattering response antenna
11 to 14 rectifier diode
15 to 19 capacitor
20 to 24 resistor
25 constant voltage diode
26 MOSFET
27 microcontroller
28 piezoelectric acceleration sensor

The invention claimed is:

1. A rotary system mounted piezoelectric generator comprising:
a beam in which a whole or part thereof is formed of a piezoelectric material and whose one end is provided in a rotation system; and
a weight which is attached to the other end of the beam, wherein the beam is formed by a folded structure in which the beam is extended from an installation point of the rotation system to the weight toward a direction of a rotation center of the rotation system such that when the rotation system is rotated, a centrifugal force applied to the weight is modulated by a second force other than the centrifugal force,
a degree of freedom of motion of the weight when seen from the rotation system is two or more-dimensional and
the beam is constantly deformed so as to correspond to a variation in a sum of a vector of the centrifugal force which is changed according to a number of revolutions of the rotation system and which is applied to the weight and a vector of the second force which does not depend on the number of revolutions of the rotation system such that a rotation center of the weight is moved according to the number of revolutions of the rotation system with the degree of freedom which is two or more-dimensional and that a locus of the weight can be changed.

2. The rotary system mounted piezoelectric generator according to claim 1,
wherein when the rotation system is rotated, the motion locus of the weight is displaced by the second force from a true circle in which the rotation center of the rotation system is a center point and is changed in a shape of an ellipse or a dynamic closed loop according to the number of revolutions of the rotation system such that the centrifugal force acting on the weight is modulated.

3. The rotary system mounted piezoelectric generator according to claim 1,
wherein the second force is gravity which is exerted on the weight.

4. A rotary system mounted piezoelectric generator comprising:
a beam in which a whole or part thereof is formed of a piezoelectric material and whose one end is provided in a rotation system; and
a weight which is attached to the other end of the beam, wherein when the rotation system is rotated, and the beam is formed in a shape of an arc having a diameter on a line connecting an installation point of the rotation system and a rotation center of the rotation system such that a motion locus of the weight is displaced from a true circle in which the rotation center of the rotation system is a center point, a length of the arc of the beam when seen from the installation point of the rotation system falls within a range from 120° to 240°.

5. The rotary system mounted piezoelectric generator according to claim 1,
wherein the beam has a spiral structure and is arranged on a plane perpendicular to a rotation shaft of the rotation system.

6. The rotary system mounted piezoelectric generator according to claim 1,
wherein the one end of the beam is inclined and is fixed to the rotation system by a movable spring structure such that the degree of freedom of motion of the weight is improved and that a vibration mode is increased.

7. The rotary system mounted piezoelectric generator according to claim 1,
wherein the weight includes a magnet or a ferromagnetic material, the second force is formed by a magnetic force and the centrifugal force acting on the weight is modulated by a variation in the magnetic force exerted on the weight.

8. The rotary system mounted piezoelectric generator according to claim 1, wherein the weight includes a fluid resistor, the second force is formed by a fluid resistance force and the centrifugal force acting on the weight is modulated by a variation in the fluid resistance force exerted on the weight.

9. A self-powered wireless communication terminal comprising:

a wireless communication means which transmits digital data from an AD converter; and the rotary system mounted piezoelectric generator according to claim 1, wherein alternating-current power obtained by the rotary system mounted piezoelectric generator is rectified and stored, is stabilized in voltage by being stepped down or stepped up and is used as a power supply voltage for the AD converter and the wireless communication means.

10. The self-powered wireless communication terminal according to claim 9, comprising:

a piezoelectric sensor which is connected to the AD converter such that a sensor output is input to the AD converter;

a capacitive AC coupling which is connected between the AD converter and the piezoelectric sensor; and a capacitor and a resistor which are connected in parallel to an output of the piezoelectric sensor so as to adjust sensitivity of the output of the piezoelectric sensor and a low frequency response cutoff frequency, wherein a resistor voltage division direct-current voltage of the power supply voltage is added to an output voltage of the piezoelectric sensor which is AC coupled such that the output voltage of the piezoelectric sensor is offset by a direct-current voltage and is input to the AD converter.

11. The self-powered wireless communication terminal according to claim 9, wherein the wireless communication means uses a subcarrier multilevel phase-shift keying (MPSK) modulation scattering communication system to perform wireless communication.

12. A wireless communication system comprising:

the self-powered wireless communication terminal according to claim 9; and one or more readers, wherein the reader utilizes maximization of a reception signal amplitude of the reader with timing at which polarized waves of an antenna of the self-powered wireless communication terminal and an antenna of the reader coincide with each other or with timing of a shortest distance so as to estimate an instantaneous rotation angle of the rotation system, to evaluate a correlation function of the rotation angle of the rotation system with respect to data received from the self-powered wireless communication terminal, to perform rotational coordinate transformation so as to transform the received data by the rotation angle of the rotation system into a stationary coordinate system and to monitor a number of revolutions of the rotation system.

13. The wireless communication system according to claim 12, wherein two or more of the readers are provided, and the readers use different inquire carrier signal frequencies so as to avoid radio interference and can simultaneously and continuously read transmission information from one or more of the self-powered wireless communication terminals.

14. The wireless communication system according to claim 12, wherein two or more of the self-powered wireless communication terminals are provided, the self-powered wireless communication terminals have different response subcarrier signal frequencies and the readers utilize the response subcarrier signal frequencies of the self-powered wireless communication terminals so as to avoid radio interference and can simultaneously and continuously read the transmission information from the self-powered wireless communication terminals.

15. The wireless communication system according to claim 12, comprising:

an analysis means, wherein two or more of the self-powered wireless communication terminals are provided, and the analysis means identifies, based on a mutual correlation function $C_{n,m}(\tau) = \int X_n(t-\tau) X_m(t) \, dt$ of observation waveform data $X_1(t), X_2(t), \ldots$ (here, t is an elapsed time) which is observed in each of the self-powered wireless communication terminals and which is received by the reader, a magnitude and a positional relationship of an event which causes the observation waveform data.

16. The wireless communication system according to claim 12, comprising:

an analysis means, wherein the rotation system has a specific convex-concave pattern in a surface which makes contact with another structure, and the analysis means obtains, based on an autocorrelation function of observation waveform data which is observed in each of the self-powered wireless communication terminals and which is received by the reader or a mutual correlation function of the specific convex-concave pattern and the observation waveform data, rotation period information on the rotation system, information on a section in which the rotation system makes contact with the another structure and information on a height of the specific convex-concave pattern.

* * * * *